United States Patent
Hatakeyama et al.

(10) Patent No.: US 9,984,878 B2
(45) Date of Patent: May 29, 2018

(54) RESIST UNDER LAYER FILM COMPOSITION AND PATTERNING PROCESS

(71) Applicant: SHIN-ETSU CHEMICAL CO., LTD., Tokyo (JP)

(72) Inventors: Jun Hatakeyama, Jyoetsu (JP); Daisuke Kori, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 1 day.

(21) Appl. No.: 15/132,625

(22) Filed: Apr. 19, 2016

(65) Prior Publication Data

US 2016/0342088 A1 Nov. 24, 2016

(30) Foreign Application Priority Data

May 18, 2015 (JP) .................................. 2015-101255
Nov. 19, 2015 (JP) .................................. 2015-226235

(51) Int. Cl.
| | |
|---|---|
| *G03F 7/11* | (2006.01) |
| *H01L 21/033* | (2006.01) |
| *C08G 8/24* | (2006.01) |
| *C08G 8/30* | (2006.01) |
| *C09D 161/12* | (2006.01) |
| *C08G 8/28* | (2006.01) |
| *C09D 161/14* | (2006.01) |
| *C08G 8/04* | (2006.01) |
| *G03F 7/075* | (2006.01) |
| *G03F 7/09* | (2006.01) |

(52) U.S. Cl.
CPC ............ *H01L 21/0338* (2013.01); *C08G 8/04* (2013.01); *C08G 8/24* (2013.01); *C08G 8/28* (2013.01); *C08G 8/30* (2013.01); *C09D 161/12* (2013.01); *C09D 161/14* (2013.01); *G03F 7/0752* (2013.01); *G03F 7/091* (2013.01); *G03F 7/094* (2013.01); *H01L 21/0332* (2013.01); *H01L 21/0335* (2013.01); *H01L 21/0337* (2013.01)

(58) Field of Classification Search
CPC ........... H01L 23/5384; H01L 21/76898; H01L 21/6835; H01L 23/481; H01L 2224/16; H01L 2221/68372; H01L 21/0338; H01L 21/0335; H01L 21/0337; H01L 21/0332; C08G 8/04; C08G 8/24; C08G 8/30; C08G 8/28; C09D 161/12; C09D 161/14; G03F 7/094; G03F 7/091; G03F 7/0752
See application file for complete search history.

(56) References Cited

U.S. PATENT DOCUMENTS

| | | | |
|---|---|---|---|
| 6,013,416 A | 1/2000 | Nozaki et al. | |
| 6,312,867 B1 | 11/2001 | Kinsho et al. | |
| 2004/0241577 A1 | 12/2004 | Hatakeyama et al. | |
| 2004/0259037 A1 | 12/2004 | Hatakeyama et al. | |
| 2006/0014106 A1 | 1/2006 | Hatakeyama et al. | |
| 2006/0019195 A1 | 1/2006 | Hatakeyama et al. | |
| 2006/0204891 A1 | 9/2006 | Hatakeyama | |
| 2006/0234158 A1 | 10/2006 | Hatakeyama | |
| 2007/0122740 A1 | 5/2007 | Hatakeyama et al. | |
| 2007/0238300 A1 | 10/2007 | Ogihara et al. | |
| 2007/0275325 A1 | 11/2007 | Hatakeyama et al. | |
| 2008/0038662 A1 | 2/2008 | Hatakeyama et al. | |
| 2008/0227037 A1 | 9/2008 | Hatakeyama et al. | |
| 2010/0047709 A1 | 2/2010 | Echigo et al. | |
| 2010/0099044 A1 | 4/2010 | Hatakeyama et al. | |
| 2010/0104977 A1 | 4/2010 | Hatakeyama et al. | |
| 2014/0273447 A1 | 9/2014 | Ogihara et al. | |
| 2014/0363957 A1 | 12/2014 | Hatakeyama et al. | |
| 2014/0363958 A1 | 12/2014 | Hatakeyama et al. | |
| 2015/0248057 A1* | 9/2015 | Ohnishi .................. | G03F 7/091 430/319 |

FOREIGN PATENT DOCUMENTS

| | | |
|---|---|---|
| JP | H09-73173 A | 3/1997 |
| JP | 2000-336121 A | 12/2000 |
| JP | 2001226430 A | 8/2001 |
| JP | 2004-205658 A | 7/2004 |
| JP | 2004-205676 A | 7/2004 |
| JP | 2004-205685 A | 7/2004 |
| JP | 2004271838 A | 9/2004 |
| JP | 2004-354554 A | 12/2004 |
| JP | 2005-010431 A | 1/2005 |
| JP | 2005-049810 A | 2/2005 |
| JP | 2005-114921 A | 4/2005 |

(Continued)

*Primary Examiner* — Cynthia Hamilton
(74) *Attorney, Agent, or Firm* — Oliff PLC

(57) ABSTRACT

The present invention provides a resist under layer film composition containing a novolak resin having a repeating unit shown by the formula (1),

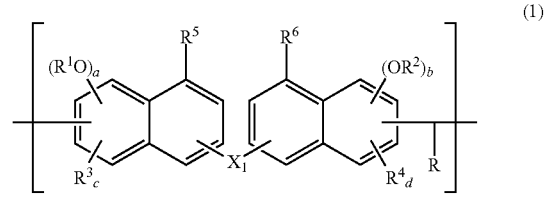

wherein R represents a group containing one or more fluorine atoms. There is provided a resist under layer film composition that is excellent in filling property, generates little outgas, and has excellent dry etching resistance and heat resistance.

16 Claims, 4 Drawing Sheets

(56) References Cited

FOREIGN PATENT DOCUMENTS

| | | | |
|---|---|---|---|
| JP | 2005-128509 | A | 5/2005 |
| JP | 2005-250434 | A | 9/2005 |
| JP | 2006-053543 | A | 2/2006 |
| JP | 2006096848 | A | 4/2006 |
| JP | 2006-227391 | A | 8/2006 |
| JP | 2006-259249 | A | 9/2006 |
| JP | 2006-259482 | A | 9/2006 |
| JP | 2006-285095 | A | 10/2006 |
| JP | 2006-293298 | A | 10/2006 |
| JP | 2006293207 | A | 10/2006 |
| JP | 2007140461 | A | 6/2007 |
| JP | 2007-171895 | A | 7/2007 |
| JP | 2007-199653 | A | 8/2007 |
| JP | 2007-302873 | A | 11/2007 |
| JP | 2007-316282 | A | 12/2007 |
| JP | 2008-026600 | A | 2/2008 |
| JP | 2008-065303 | A | 3/2008 |
| JP | 2008-096684 | A | 4/2008 |
| JP | 2008116677 | A | 5/2008 |
| JP | 2008145539 | A | 6/2008 |
| JP | 2008-257188 | A | 10/2008 |
| JP | 2010134437 | A | 6/2010 |
| JP | 2010160189 | A | 7/2010 |
| JP | 2010-170013 | A | 8/2010 |
| JP | 2010271654 | A | 12/2010 |
| JP | 4659678 | B2 | 3/2011 |
| JP | 5336306 | B2 | 11/2013 |
| JP | 2014-178602 | A | 9/2014 |
| JP | 2015018221 | A | 1/2015 |
| JP | 2015018223 | A | 1/2015 |
| WO | WO 2014/038483 | A1 * | 3/2014 |

* cited by examiner

RESIST UNDER LAYER FILM COMPOSITION AND PATTERNING PROCESS

BACKGROUND OF THE INVENTION

Field of the Invention

The present invention relates to a resist under layer film composition for fine patterning in a manufacturing process of a semiconductor apparatus and the like, and to a patterning process.

Description of the Related Art

In recent years, double patterning which includes repeating lithography and etching steps (LELE, Litho-Etch-Litho-Etch) has been used to form interconnect with high density by three-dimensional gate such as ultra-fine and dense Fin-field effect transistor (Fin-FET) or dual damascene, in which trenches and vias of copper interconnect are formed at the same time. Accordingly, materials capable of filling gaps with high aspect ratio and high density have been demanded. Filling gaps makes the film surface flatten and facilitates focus leveling in lithography, thus enabling patterning with an adequate margin even if the focus margin is narrow.

A spin coating method has been commonly used for planarizing a substrate having gaps. Otherwise, the gaps can be filled by forming an amorphous carbon film by chemical vapor deposition (CVD) method, but this method has a disadvantage of process cost because the surface becomes uneven and the film surface is required to be ground by chemical mechanical polishing (CMP) method to planarize it. Moreover, there is a problem that the amorphous carbon film formed by the CVD method fails to fill ultra-fine gaps with a pitch of 50 nm or less because voids occur in the bottom of the gaps. The ultra-fine gaps with a pitch of 50 nm or less can be filled by spin coating of a material containing a large amount of low molecular weight components.

A liquid immersion lithography makes an angle of incident light to a resist and an underlying layer(s) shallower and substrate reflection larger. To suppress the substrate reflection, a multi-layer antireflection film is effectively formed under the resist. A 3-layer (tri-layer) structure in which a hydrocarbon film (a resist under layer film) with high carbon density is formed on a substrate, a silicon-containing resist middle layer film is formed thereon, and a resist upper layer film is formed thereon can prevent the substrate reflection by the two layers of the hydrocarbon film and the silicon-containing middle layer film. Thus, the application of this technique has been rapidly spreading with use of the liquid immersion lithography.

The resist under layer film is required to have functions such as filling and planarizing properties by spin coating, high dry-etching resistance for dry etching a substrate, and optimum optical properties for providing high antireflection effect.

The resist under layer film is also required to have high heat resistance in some cases, for example, when a hard mask layer such as p-Si, SiN, SiON, TiN, $ZrO_2$, and $HfO_2$ is formed on the resist under layer film because these films need a temperature exceeding 300° C. to be formed.

Examples of a resist under layer film material with high heat resistance include a bisnaphthol compound and a novolak resin thereof disclosed in Patent Document 1, bisnaphthol fluorene and a novolak resin thereof disclosed in Patent Document 2, a novolak resin of naphthol phthalein disclosed in Patent Document 3, and a novolak resin of naphthofluorescein disclosed in Patent Document 4.

In addition, there is a problem of outgas generated in baking for forming a resist under layer film. The outgas component adheres to an upper plate above a hot plate, and when the component drops onto a wafer, a defect is generated. To improve the property of filling gaps of a substrate, monomer components (low molecular weight components) are effectively added to the resist under layer film composition. However, the more the monomer components are added, the more outgas is generated in baking at high temperature. In other words, there is a trade-off relationship between the improvement in filling property and the reduction in outgas. Therefore, a resist under layer film composition that can overcome the trade-off relationship has been demanded.

PRIOR ART DOCUMENTS

Patent Documents

[Patent Document 1] Japanese Patent No. 4659678
[Patent Document 2] Japanese Patent No. 5336306
[Patent Document 3] Japanese Patent Laid-Open Publication No. 2015-018221
[Patent Document 4] Japanese Patent Laid-Open Publication No. 2015-018223

SUMMARY OF THE INVENTION

The present invention has been accomplished in view of the above circumstances, and an object thereof is to provide a resist under layer film composition that has good filling property, generates little outgas, and is excellent in dry-etching resistance and heat resistance.

To achieve this object, the present invention provides a resist under layer film composition comprising a novolak resin having a repeating unit shown by the formula (1),

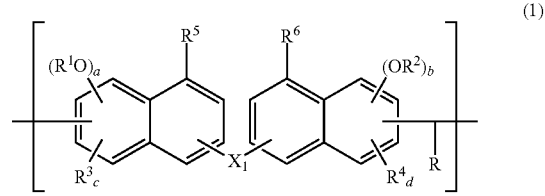

wherein $R^1$ and $R^2$ represent a hydrogen atom, an acid-labile group, a glycidyl group, or a linear, branched, or cyclic alkyl, alkenyl, alkynyl, acyl, or alkoxycarbonyl group having 1 to 10 carbon atoms; $R^3$ and $R^4$ represent a hydrogen atom, a halogen atom, a hydroxyl group, an alkoxy group having 1 to 4 carbon atoms, a linear, branched, or cyclic alkyl group having 1 to 10 carbon atoms, an alkenyl group having 2 to 10 carbon atoms, or an aryl group having 6 to 10 carbon atoms, in which the alkyl group, the alkenyl group, and the aryl group may contain a hydroxyl group, an alkoxy group, an acyloxy group, an ether group, or a sulfide group; $R^5$ and $R^6$ represent a hydrogen atom, or $R^5$ and $R^6$ may be bonded each other to form an ether bond; R represents an alkyl group having 1 to 10 carbon atoms or an aryl group having 6 to 16 carbon atoms, in which the alkyl group and the aryl group contain one or more fluorine atoms and may contain one or more groups selected from a hydroxyl group, an ether group, a sulfide group, a carboxyl group, and a nitrogen atom; $X_1$ represents a single bond or a linear, branched, or cyclic divalent hydrocarbon group having 1 to 38 carbon atoms and optionally containing a hydroxyl group, a carboxyl group, an ether group, or a lactone ring, and when $X_1$ is a divalent hydrocarbon group, $R^5$ and $R^6$ may bond to carbon atoms in $X_1$ to form an ether bond; and a, b, c, and d are each 1 or 2.

The introduction of fluorine into the repeating units reduces intermolecular bonding strength between the polymers and increases flowability during heating, thus improving film flatness and filling property with respect to a substrate with gaps in which a fine trench pattern is formed. Thus, such a resist under layer film composition has good filling property, generates little outgas, and is excellent in dry-etching resistance and heat resistance.

The resist under layer film composition preferably further comprises a substituted or unsubstituted bisnaphthol resin containing no fluorine atom.

Such a resist under layer film composition has better filling property and can more greatly reduce generation of outgas.

The resist under layer film composition preferably further comprises either or both of a novolak resin having a repeating unit shown by the formula (2) and a bisnaphthol derivative shown by the formula (3),

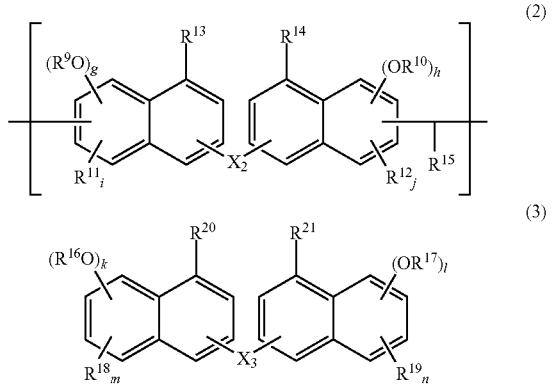

wherein $R^9$, $R^{10}$, $R^{16}$, and $R^{17}$ independently represent a hydrogen atom, an acid-labile group, a glycidyl group, or a linear, branched, or cyclic alkyl, acyl, or alkoxycarbonyl group having 1 to 10 carbon atoms; $R^{11}$, $R^{12}$, $R^{18}$, and $R^{19}$ independently represent a hydrogen atom, a halogen atom, a hydroxyl group, an alkoxy group having 1 to 4 carbon atoms, a linear, branched, or cyclic alkyl group having 1 to 10 carbon atoms, an alkenyl group having 2 to 10 carbon atoms, or an aryl group having 6 to 10 carbon atoms, in which the alkyl group, the alkenyl group, and the aryl group may contain a hydroxyl group, an alkoxy group, an acyloxy group, an ether group, or a sulfide group; $R^{13}$, $R^{14}$, $R^{20}$, and $R^{21}$ independently represent a hydrogen atom, or $R^{13}$ and $R^{20}$ may bond to $R^{14}$ and $R^{21}$ respectively to form an ether bond; $R^{15}$ represents a hydrogen atom, an alkyl group having 1 to 6 carbon atoms, an alkenyl group having 2 to 10 carbon atoms, or an aryl group having 6 to 10 carbon atoms, in which the alkyl group, the alkenyl group, and the aryl group may contain a hydroxyl group, an alkoxy group, an acyloxy group, an ether group, a sulfide group, a chloro group, or a nitro group; $X_2$ and $X_3$ independently represent a single bond or a linear, branched, or cyclic divalent hydrocarbon group having 1 to 38 carbon atoms and optionally containing a hydroxyl group, a carboxyl group, an ether group, or a lactone ring, when $X_2$ is a divalent hydrocarbon group, $R^{13}$ and $R^{14}$ may bond to carbon atoms in $X_2$ to form an ether bond, and when $X_3$ is a divalent hydrocarbon group, $R^{20}$ and $R^{21}$ may bond to carbon atoms in $X_3$ to form an ether bond; and g, h, i, j, k, l, m, and n are each 1 or 2.

Such a resist under layer film composition has better filling property and can more greatly reduce generation of outgas.

It is preferred that the novolak resin having the repeating unit shown by the formula (1) be a condensate of a substituted or unsubstituted bisnaphthol derivative with an aldehyde having at least one fluorine atom, and the novolak resin having the repeating unit shown by the formula (2) be a condensate of a substituted or unsubstituted bisnaphthol derivative with an aldehyde having no fluorine atom.

Such condensates are suitably used as the novolak resins used in the inventive resist under layer film composition.

The resist under layer film composition preferably comprises the novolak resin having the repeating unit shown by the formula (1), the novolak resin having the repeating unit shown by the formula (2), and the bisnaphthol derivative shown by the formula (3).

The composition containing all three components of the novolak resin having the repeating unit shown by the formula (1), the novolak resin having the repeating unit shown by the formula (2), and the bisnaphthol derivative shown by the formula (3) can achieve the improvement in filling property and the reduction in outgas with good balance.

A total amount of the novolak resin having the repeating unit shown by the formula (2) and the bisnaphthol derivative shown by the formula (3) is preferably 5 to 10000 parts by mass with respect to 100 parts by mass of the novolak resin having the repeating unit shown by the formula (1).

Such a ratio enables the improvement in filling property and the reduction in outgas to be achieved with particularly good balance.

The resist under layer film composition preferably further comprises an organic solvent.

The organic solvent enables the concentration and the viscosity of the resist under layer film composition to be adjusted, and improves compatibility.

The resist under layer film composition preferably further comprises an acid generator and/or a crosslinking agent.

These components promote crosslinking curing reaction of the resist under layer film composition.

Furthermore, the present invention provides a patterning process for forming a pattern in a substrate by lithography, comprising: forming a resist under layer film on a substrate to be processed by using the above-described resist under layer film composition; forming a silicon-containing middle layer film on the resist under layer film by using a silicon-containing middle layer film composition; forming a resist upper layer film on the silicon-containing middle layer film by using a resist upper layer film composition; forming a resist pattern in the resist upper layer film by exposure of a pattern circuit region of the resist upper layer film and development; transferring the pattern to the silicon-containing middle layer film by etching using the resist upper layer film having the formed resist pattern as a mask; transferring the pattern to the resist under layer film by etching using the silicon-containing resist middle layer film having the transferred pattern as a mask; forming the pattern in the substrate to be processed by etching using the resist under layer film having the transferred pattern as a mask.

Furthermore, the present invention provides a patterning process for forming a pattern in a substrate by lithography, comprising: forming a resist under layer film on a substrate to be processed by using the above-described resist under layer film composition; forming an inorganic hard mask intermediate film selected from a silicon oxide film, a silicon nitride film, a silicon oxynitride film, a silicon carbide film, a polysilicon film, a titanium nitride film, a titanium oxide film, a titanium carbide film, a zirconium oxide film, and a hafnium oxide film on the resist under layer film; forming a resist upper layer film on the inorganic hard mask intermediate film by using a resist upper layer film composition; forming a resist pattern in the resist upper layer film by exposure of a pattern circuit region of the resist upper layer film and development; transferring the pattern to the inorganic hard mask intermediate film by etching using the resist upper layer film having the formed resist pattern as a mask; transferring the pattern to the resist under layer film by etching using the inorganic hard mask intermediate film having the transferred pattern as a mask; forming the pattern in the substrate to be processed by etching using the resist under layer film having the transferred pattern as a mask.

Furthermore, the present invention provides a patterning process for forming a pattern in a substrate by lithography, comprising: forming a resist under layer film on a substrate to be processed by using the above-described resist under layer film composition; forming an inorganic hard mask intermediate film selected from a silicon oxide film, a silicon nitride film, a silicon oxynitride film, a silicon carbide film, a polysilicon film, a titanium nitride film, a titanium oxide film, a titanium carbide film, a zirconium oxide film, and a hafnium oxide film on the resist under layer film; forming an organic antireflection film on the inorganic hard mask intermediate film; forming a resist upper layer film on the organic antireflection film by using a resist upper layer film composition, thereby forming a 4-layer resist film; forming a resist pattern in the resist upper layer film by exposure of a pattern circuit region of the resist upper layer film and development; transferring the pattern to the organic antireflection film and the inorganic hard mask intermediate film by etching using the resist upper layer film having the formed resist pattern as a mask; transferring the pattern to the resist under layer film by etching using the inorganic hard mask intermediate film having the transferred pattern as a mask; forming the pattern in the substrate to be processed by etching using the resist under layer film having the transferred pattern as a mask.

Furthermore, the present invention provides a patterning process for forming a pattern in a substrate by lithography, comprising: forming a resist under layer film on a substrate to be processed by using the above-described resist under layer film composition; forming an inorganic hard mask intermediate film selected from a silicon oxide film, a silicon nitride film, a silicon oxynitride film, a silicon carbide film, a polysilicon film, a titanium nitride film, a titanium oxide film, a titanium carbide film, a zirconium oxide film, and a hafnium oxide film on the resist under layer film; forming a hydrocarbon film on the inorganic hard mask intermediate film by using a hydrocarbon film composition by spin coating; forming a silicon-containing middle layer film on the hydrocarbon film by using a silicon-containing middle layer film composition; forming a resist upper layer film on the silicon-containing middle layer film by using a resist upper layer film composition, thereby forming a 5-layer resist film; forming a resist pattern in the resist upper layer film by exposure of a pattern circuit region of the resist upper layer film and development; transferring the pattern to the silicon-containing middle layer film by etching using the resist upper layer film having the formed resist pattern as a mask; transferring the pattern to the hydrocarbon film by etching using the silicon-containing middle layer film having the transferred pattern as a mask; transferring the pattern to the inorganic hard mask intermediate film by etching using the hydrocarbon film having the transferred pattern as a mask; transferring the pattern to the resist under layer film by etching using the inorganic hard mask intermediate film having the transferred pattern as a mask; forming the pattern in the substrate to be processed by etching using the resist under layer film having the transferred pattern as a mask.

The patterning process using the inventive resist under layer film composition that has good filling property, generates little outgas, and is excellent in dry-etching resistance and heat resistance can significantly reduce defects at fine processing. In the manufacturing process of a semiconductor apparatus and the like.

The inorganic hard mask intermediate film is preferably formed by a CVD method, an ALD method, or a sputtering method.

Such methods are suitable for forming the inorganic hard mask intermediate film.

It is preferred that the resist upper layer film composition do not contain a polymer having a silicon atom, and the etching of the resist under layer film using the silicon-containing middle layer film or the inorganic hard mask intermediate film as a mask be performed with an etching gas containing an oxygen gas or a hydrogen gas.

In this manner, removal of the resist upper layer film and etching of the resist under layer film can be performed at the same time.

As mentioned above, the inventive resist under layer film composition has good filling property, generates little outgas, and can form a resist under layer film having excellent dry-etching resistance and heat resistance. The resist under layer film is also improved in film thickness uniformity. In addition, the inventive patterning process using such a resist under layer film composition allows a substrate to be sufficiently embedded, prevents generation of outgas, and thus significantly reduces defects at fine processing in the manufacturing process of a semiconductor apparatus and the like. Accordingly, the resist under layer film composition and the patterning process of the present invention are especially suitable for manufacturing a three-dimension device such as Fin-FET, which requires filling a trench pattern having narrow pitch and inhibiting generation of outgas during baking of the resist under layer film that may cause defects.

DETAILED DESCRIPTION OF THE PREFERRED EMBODIMENTS

Figure 1:
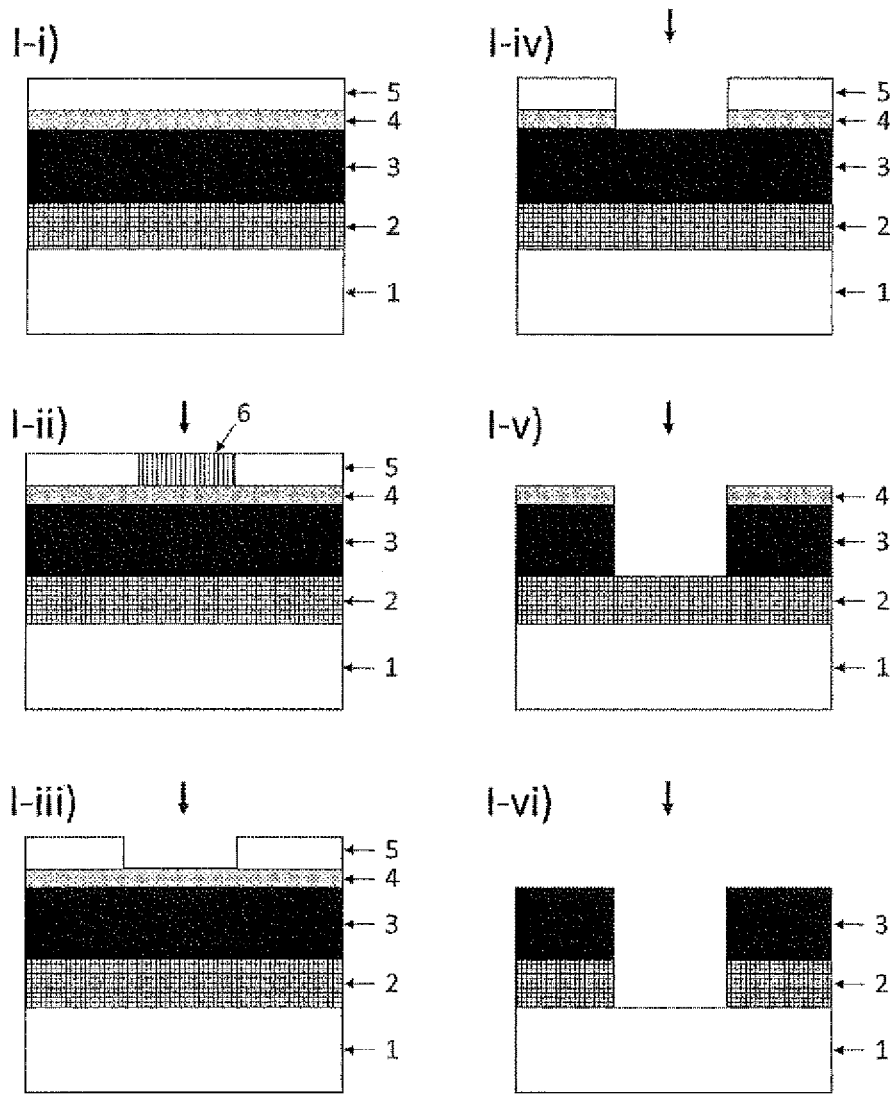
FIG. 1 is a flow chart showing an example of the inventive patterning process by 3-layer process using a silicon-containing middle layer film.

As mentioned above, it has been desired to develop a resist under layer film composition that has good filling property and generates little outgas. To improve filling property, monomer components are effectively added to the resist under layer film composition. However, when monomer components are added, the monomer components evaporate at baking to generate outgas, and the outgas adheres to an upper plate above a hot plate. Drop of the substance adhering to the upper plate causes a defect, so that the improvement performance in filling property and the outgas prevention performance have a trade-off relationship. The present inventors have intensively studied to formulate a resist under layer film composition that has good filling property and generates little outgas, and found that the improvement in filling property and the inhibition of outgas generation are simultaneously achieved by a resist under layer film configured such that, when monomer components are contained therein, the side of a substrate with gaps contains many monomer components that are effective in filling, while the surface layer side contains many polymer components.

The present inventors have further studied and consequently found that a resist under layer film composition containing a novolak resin having a repeating unit shown by the formula (1) can improve filling property and inhibit generation of outgas even if the composition contains a large amount of monomer components. The present inventors further found that adding either or both of a novolak resin having a repeating unit shown by the formula (2) and a bisnaphthol derivative shown by the formula (3) can more effectively improve filling property and reduce generation of outgas. The present invention was thereby brought to completion.

That is, the present invention is a resist under layer film composition comprising a novolak resin having a repeating unit shown by the formula (1),

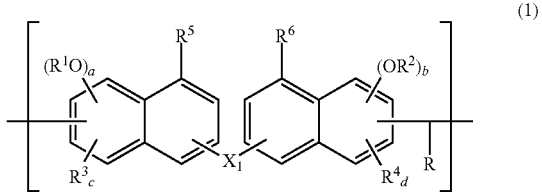

wherein $R^1$ and $R^2$ represent a hydrogen atom, an acid-labile group, a glycidyl group, or a linear, branched, or cyclic alkyl, alkenyl, alkynyl, acyl, or alkoxycarbonyl group having 1 to 10 carbon atoms; $R^3$ and $R^4$ represent a hydrogen atom, a halogen atom, a hydroxyl group, an alkoxy group having 1 to 4 carbon atoms, a linear, branched, or cyclic alkyl group having 1 to 10 carbon atoms, an alkenyl group having 2 to 10 carbon atoms, or an aryl group having 6 to 10 carbon atoms, in which the alkyl group, the alkenyl group, and the aryl group may contain a hydroxyl group, an alkoxy group, an acyloxy group, an ether group, or a sulfide group; $R^5$ and $R^6$ represent a hydrogen atom, or $R^5$ and $R^6$ may be bonded each other to form an ether bond; R represents an alkyl group having 1 to 10 carbon atoms or an aryl group having 6 to 16 carbon atoms, in which the alkyl group and the aryl group contain one or more fluorine atoms and may contain one or more groups selected from a hydroxyl group, an ether group, a sulfide group, a carboxyl group, and a nitrogen atom; $X_1$ represents a single bond or a linear, branched, or cyclic divalent hydrocarbon group having 1 to 38 carbon atoms and optionally containing a hydroxyl group, a carboxyl group, an ether group, or a lactone ring, and when $X_1$ is a divalent hydrocarbon group, $R^5$ and $R^6$ may bond to carbon atoms in $X_1$ to form an ether bond; and a, b, c, and d are each 1 or 2.

Furthermore, the inventive resist under layer film composition preferably contains a substituted or unsubstituted bisnaphthol resin containing no fluorine atom. More specifically, the composition preferably contains, in addition to the novolak resin having a repeating unit shown by the formula (1), either or both of a novolak resin having a repeating unit shown by the formula (2) and a bisnaphthol derivative shown by the formula (3),

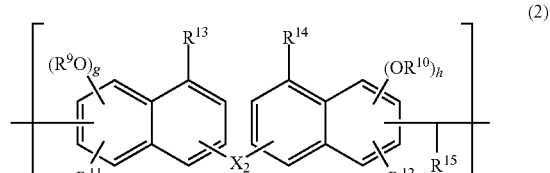

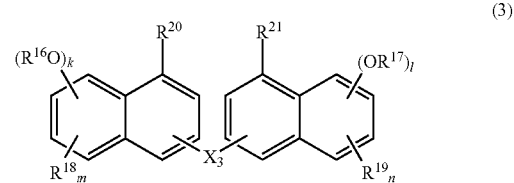

wherein $R^9$, $R^{10}$, $R^{16}$, and $R^{17}$ independently represent a hydrogen atom, an acid-labile group, a glycidyl group, or a linear, branched, or cyclic alkyl, acyl, or alkoxycarbonyl group having 1 to 10 carbon atoms; $R^{11}$, $R^{12}$, $R^{18}$, and $R^{19}$ independently represent a hydrogen atom, a halogen atom, a hydroxyl group, an alkoxy group having 1 to 4 carbon atoms, a linear, branched, or cyclic alkyl group having 1 to 10 carbon atoms, an alkenyl group having 2 to 10 carbon atoms, or an aryl group having 6 to 10 carbon atoms, in which the alkyl group, the alkenyl group, and the aryl group may contain a hydroxyl group, an alkoxy group, an acyloxy group, an ether group, or a sulfide group; $R^{13}$, $R^{14}$, $R^{20}$, and $R^{21}$ independently represent a hydrogen atom, or $R^{13}$ and $R^{20}$ may bond to $R^{14}$ and $R^{21}$ respectively to form an ether bond; $R^{15}$ represents a hydrogen atom, an alkyl group having 1 to 6 carbon atoms, an alkenyl group having 2 to 10 carbon atoms, or an aryl group having 6 to 10 carbon atoms, in which the alkyl group, the alkenyl group, and the aryl group may contain a hydroxyl group, an alkoxy group, an acyloxy group, an ether group, a sulfide group, a chloro group, or a nitro group; $X_2$ and $X_3$ independently represent a single bond or a linear, branched, or cyclic divalent hydrocarbon group having 1 to 38 carbon atoms and optionally containing a hydroxyl group, a carboxyl group, an ether group, or a lactone ring, when $X_2$ is a divalent hydrocarbon group, $R^{13}$ and $R^{14}$ may bond to carbon atoms in $X_2$ to form an ether bond, and when $X_3$ is a divalent hydrocarbon group, $R^{20}$ and $R_{21}$ may bond to carbon atoms in $X_3$ to form an ether bond; and g, h, i, j, k, l, m, and n are each 1 or 2.

Hereinafter, the present invention will be described in detail, but the present invention is not limited thereto.

<Resist Under Layer Film Composition>

The inventive resist under layer film composition contains the fluorinated bisnaphthol novolak resin having the repeating unit shown by the formula (1). The fluorinated bisnaphthol novolak resin has lower viscosity, higher flowability during baking at high temperature, and thus more excellent planarizing property for an uneven substrate than a non-fluorinated bisnaphthol novolak resin. In addition to this, the composition may contain either or both of the novolak resin having the repeating unit shown by the formula (2) and the bisnaphthol derivative shown by the formula (3). When such a resist under layer film composition is used, the fluorinated bisnaphthol resin shown by the formula (1) covers the film surface during spin coating. The presence of the fluorine-containing layer enables generation of outgas to be inhibited even when the resist under layer film composition containing monomer components for improving filling property is baked at high temperature.

The repeating unit shown by the formula (1) is preferably, but not particularly limited to, a repeating unit shown by the formula (1'),

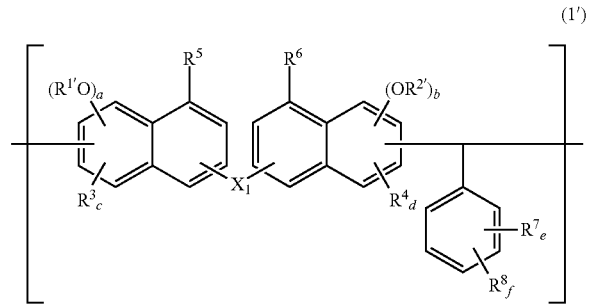

wherein $R^3$, $R^4$, $R^5$, $R^6$, $X_1$, a, b, c, and d are as defined above; $R^{1'}$ and $R^{2'}$ independently represent a hydrogen atom, an acid-labile group, a glycidyl group, or a linear, branched, or cyclic alkyl, acyl, or alkoxycarbonyl group having 1 to 10 carbon atoms; $R^7$ represents a fluorine atom, a fluorine-containing alkyl or alkoxy group having 1 to 4 carbon atoms, or a substituted or unsubstituted 1,1,1,3,3,3-hexafluoro-2-propanol group, in which these groups may contain a sulfide group; $R^8$ represents a hydrogen atom, a hydroxyl group, a carboxyl group, or an alkyl, alkoxy, or alkoxycarbonyl group having 1 to 6 carbon atoms; e is an integer of 1 to 5, f is an integer of 0 to 4, and e+f=5.

The property of filling gaps of a substrate is further improved by adding the bisnaphthol derivative shown by the formula (3) as a monomer component. Generally, addition of such a monomer component increases generation of outgas in baking. However, as mentioned above, in the inventive resist under layer film composition, the fluorinated bisnaphthol novolak resin shown by the formula (1) moves to the surface of the resist under layer film during coating, and a resin layer containing a large amount of this resin is formed at the surface of the resist under layer film. Since the resist under layer film surface is coated with the resin layer of the fluorine-containing bisnaphthol novolak resin, even when monomer components are contained, it is possible to inhibit the monomer components from evaporating from the resist under layer film surface and causing outgas during baking. This is an effective means to inhibit generation of outgas and improve filling property.

In addition, formation of the fluorine-containing layer at the resist under layer film surface is also effective in prevention of damage to the resist under layer film surface caused when a silicon-containing middle layer film (SOG film) on the resist under layer film is removed with a hydrofluoric acid aqueous solution or when a TiN film or a Boron Phosphorus Silicate Glass (BPSG) film is removed with an alkali removing liquid, Standard Clean (SC) 1. This is because fluorine, which has water-repellency, can prevent the hydrofluoric acid aqueous solution and the SC1 from soaking into the resist under layer film.

Further advantageously, the naphthalene ring can inhibit reflection from the resist under layer film because of its relatively small absorption at 193 nm wavelength of ArF excimer laser, and exhibits high dry-etching resistance because it is a condensed aromatic ring.

In some cases, above the resist under layer film, not only a silicon-containing middle layer film is formed by spin coating, but also an inorganic film, such as a SiON film and a TiN film, which serves as both an antireflection film and a hard mask is formed. The SiON film has not only excellent antireflection effect but also higher dry-etching resistance than the silicon-containing middle layer film formed by spin coating. The TiN film has advantages of high dry-etching resistance and removability with an alkali removing liquid such as SC1. Since the SiON film and the TiN film require a substrate temperature of 300° C. or higher to be formed, a resist under layer film having inadequate heat resistance cannot be used in a method including forming such an inorganic film even if the dry-etching resistance and other properties are excellent. By contrast, a resist under layer film formed from the inventive resist under layer film composition has adequate heat resistance, so that it can be suitably used even when an inorganic film that needs to be heated at 300° C. or higher is formed, as mentioned above.

When an under layer film solution is applied onto a substrate having gaps, for example, having a hole pattern, bubbles exist in bottoms of the holes just after the application, and the bottoms of the holes are filled after baking at high temperature. This indicates that the resin flows to fill the bottoms of the holes in baking, and the bubbles (voids) move toward the under layer film surface and then disappear.

In general, when a solution containing a resin is applied by spin coating at a low speed of 500 rpm or less and the solvent is then evaporated by baking, the film thickness becomes nonuniform. By contrast, when the solution is applied by spin coating at 700 rpm or more, phenomenon of thickness nonuniformity does not occur. The phenomenon that film thickness becomes nonuniform by low speed spin coating followed by baking is attributable to Marangoni effect.

Marangoni effect is supposed to occur also when an under layer film resin is baked at high temperature. In the case that a resin material composed of only monomers is used, pull-back phenomenon from wafer edge and the phenomenon of nonuniform thickness after coating can be explained by Marangoni effect. Movement of a high-temperature substance, which has low surface tension, toward the film surface decreases temperature and thus increases the surface tension. In general, a film in which the film surface is covered with a material having low surface tension is energetically stable. Conversely, Marangoni effect makes the film energetically unstable, resulting in thickness nonuniformity.

By contrast, the inventive resist under layer film composition contains a fluorine-containing material with low surface tension (i.e., the novolak resin having the repeating unit shown by the formula (1)). Therefore, the film surface is covered with the material with low surface tension, which resolves instability due to Marangoni effect. In other words, film thickness uniformity can also be improved.

As mentioned above, the inventive resist under layer film composition contains the fluorinated bisnaphthol novolak resin having the repeating unit shown by the formula (1) as an essential component and preferably further contains either or both of the novolak resin having the repeating unit shown by the formula (2) and the bisnaphthol derivative shown by the formula (3). That is, the composition may contain the novolak resin having the repeating unit shown by the formula (1) alone, may contain the novolak resin having the repeating unit shown by the formula (1) and the novolak resin having the repeating unit shown by the formula (2) but not the bisnaphthol derivative shown by the formula (3), or may contain the novolak resin having the repeating unit shown by the formula (1) and the bisnaphthol derivative shown by the formula (3) but not the novolak resin having the repeating unit shown by the formula (2). Alternatively, the composition may contain all three components of the novolak resin having the repeating unit shown by the formula (1), the novolak resin having the repeating unit shown by the formula (2), and the bisnaphthol derivative shown by the formula (3).

Above all, the composition most preferably contains all three components of the novolak resin having the repeating unit shown by the formula (1), the novolak resin having the repeating unit shown by the formula (2), and the bisnaphthol derivative shown by the formula (3).

When the composition contains all three components of the novolak resin having the repeating unit shown by the formula (1), the novolak resin having the repeating unit shown by the formula (2), and the bisnaphthol derivative shown by the formula (3), both the improvement in filling property and the reduction in outgas can be achieved with better balance.

The novolak resin having the repeating unit shown by the formula (1) contained in the inventive resist under layer film composition is preferably a condensate of a substituted or unsubstituted bisnaphthol derivative with an aldehyde having at least one fluorine atom. The novolak resin having the repeating unit shown by the formula (2) is preferably a condensate of a substituted or unsubstituted bisnaphthol derivative with an aldehyde having no fluorine atom.

Such condensates can be suitably used as the novolak resins used in the inventive resist under layer film composition.

Illustrative examples of the linear, branched, or cyclic divalent hydrocarbon group having 1 to 38 carbon atoms represented by $X_1$, $X_2$, and $X_3$ include linear, branched, or cyclic alkylene, arylene, and aralkylene groups having 1 to 38 carbon atoms.

Illustrative examples of a bisnaphthol derivative usable as a monomer to give the novolak resins having the repeating unit shown by the formula (1) or (2) include the following compounds. The following compounds can also be used as the bisnaphthol derivative shown by the formula (3).

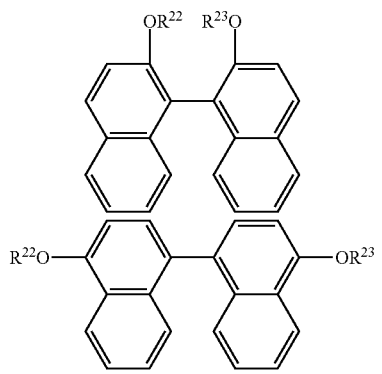

-continued

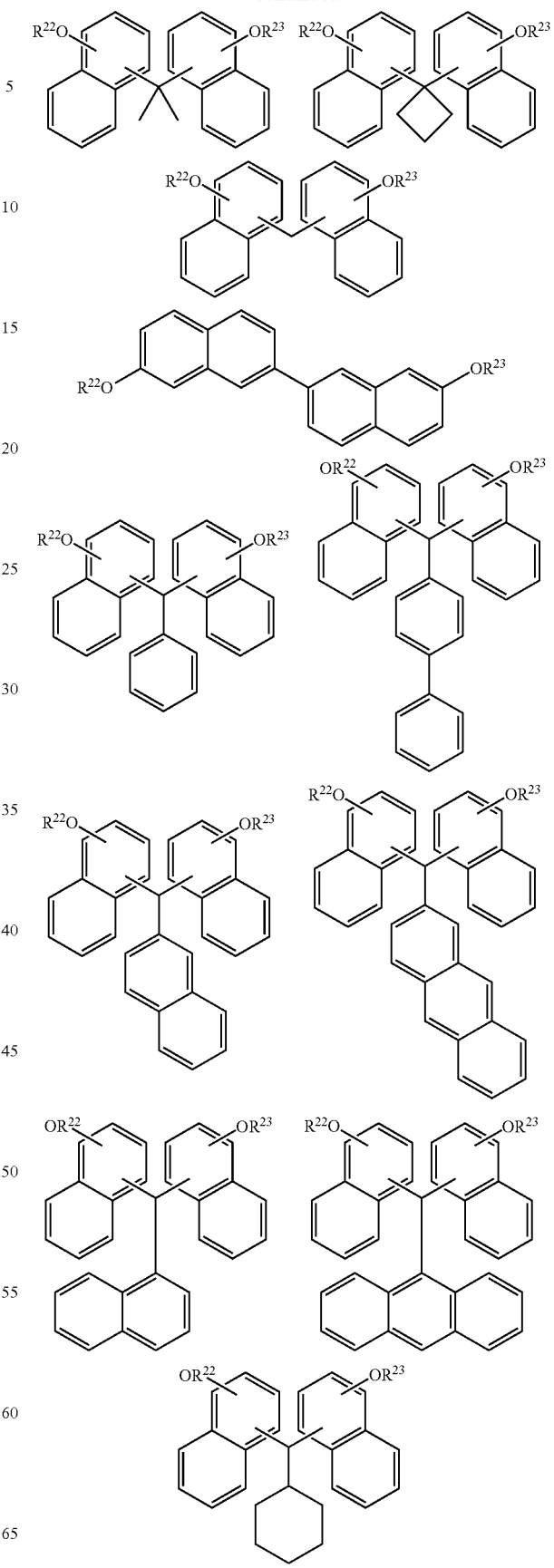

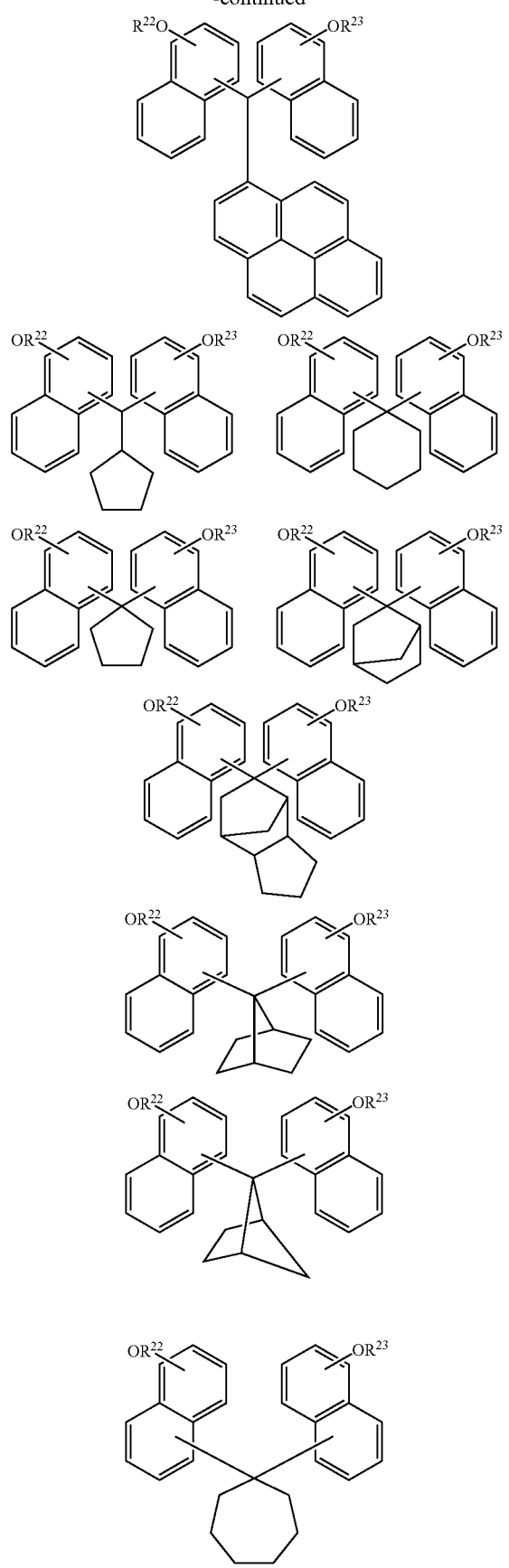
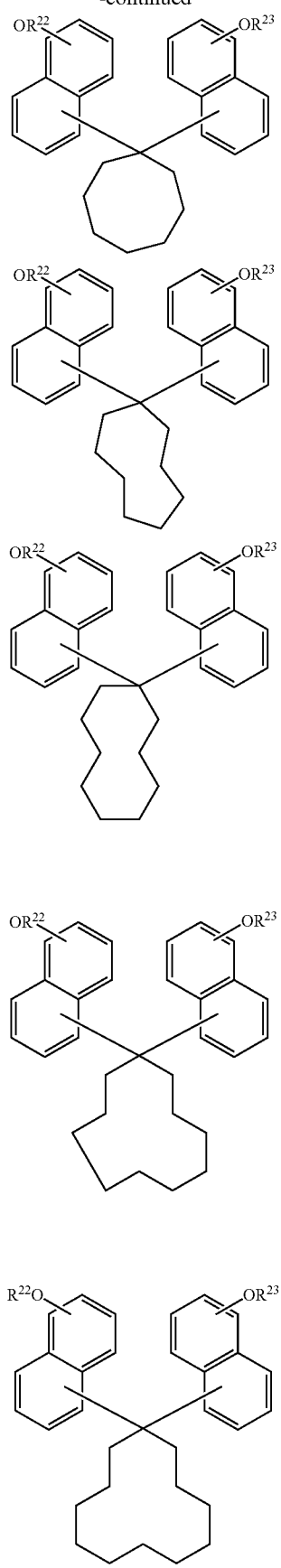

-continued
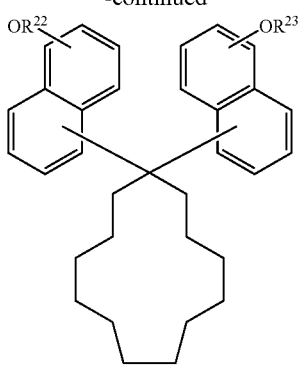
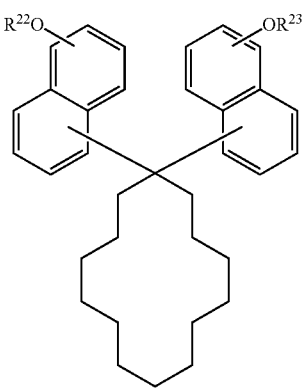
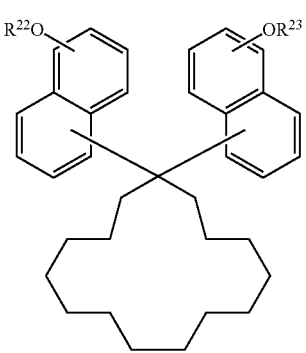
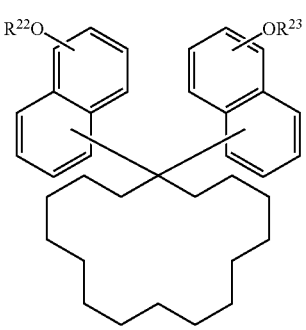
-continued
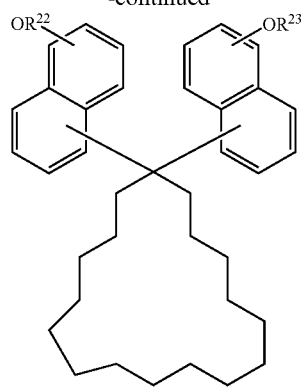
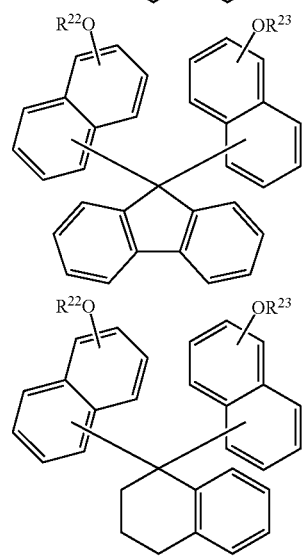
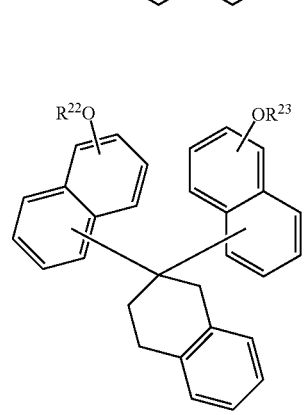
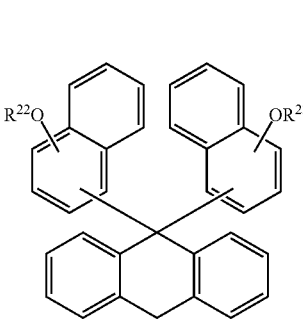

-continued
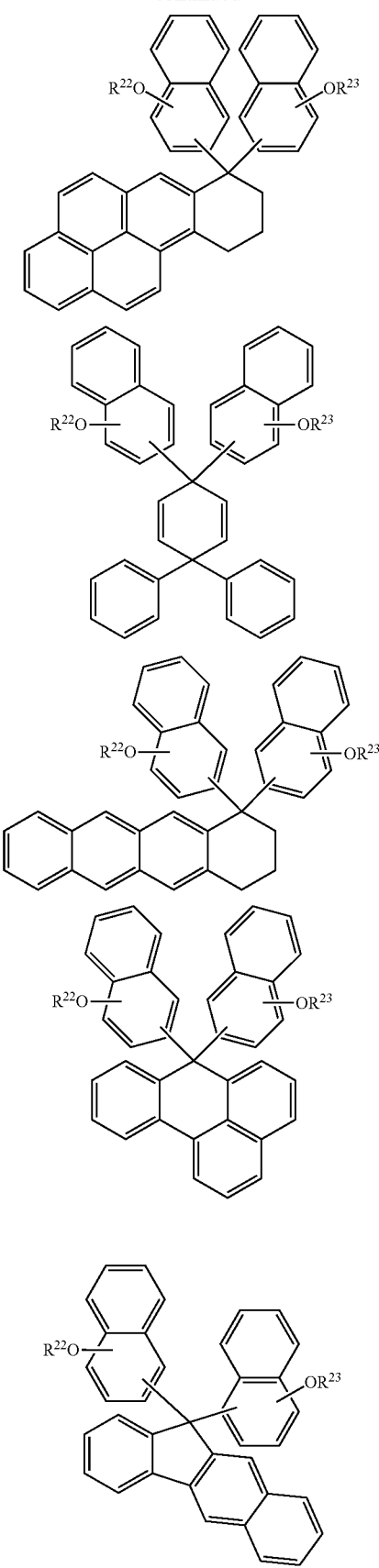
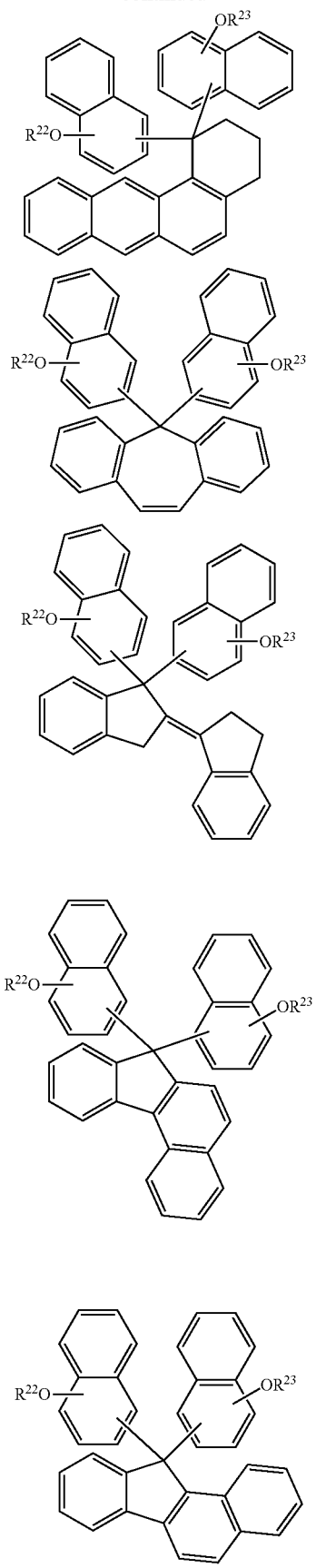

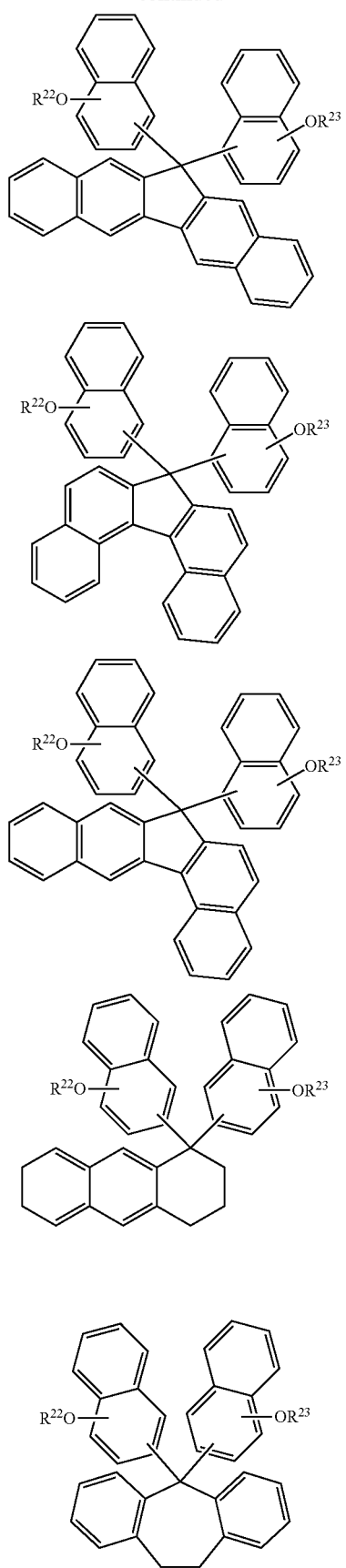
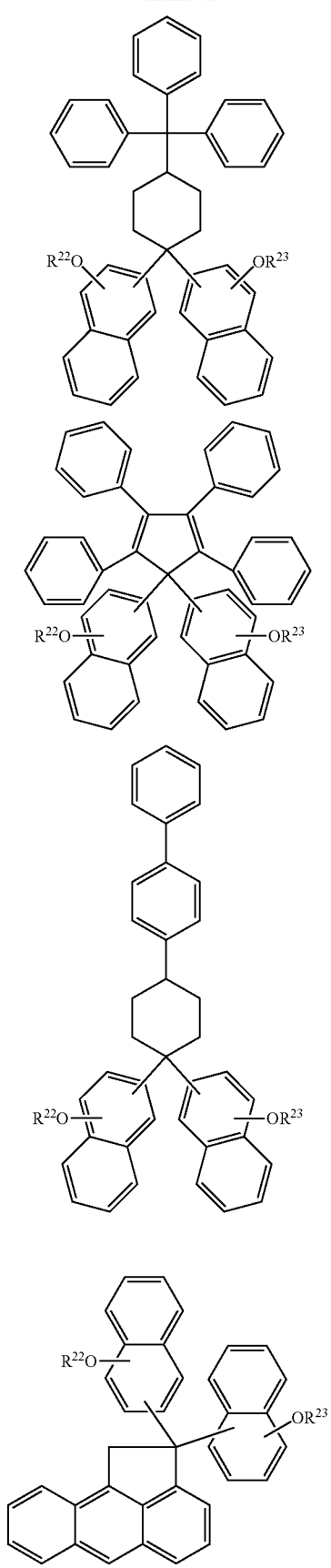

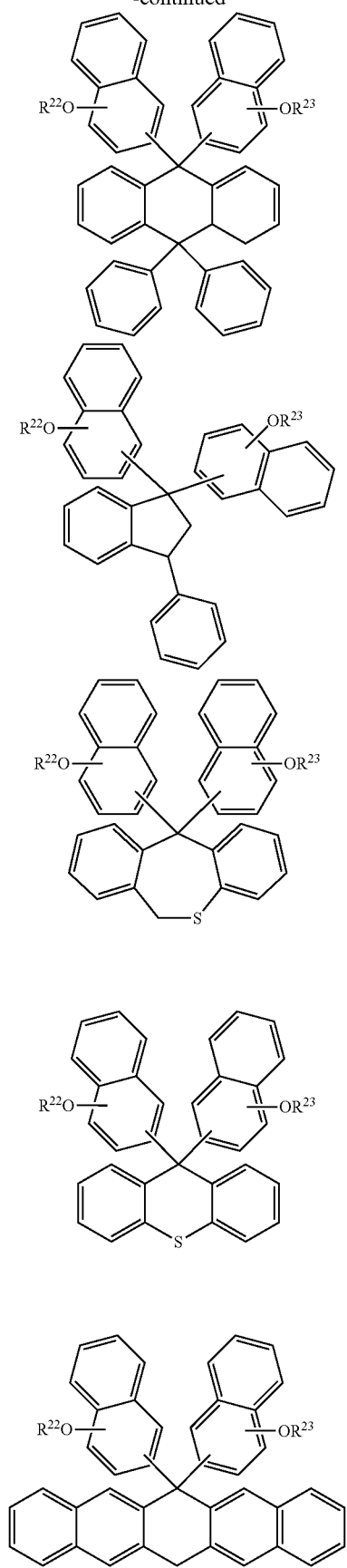
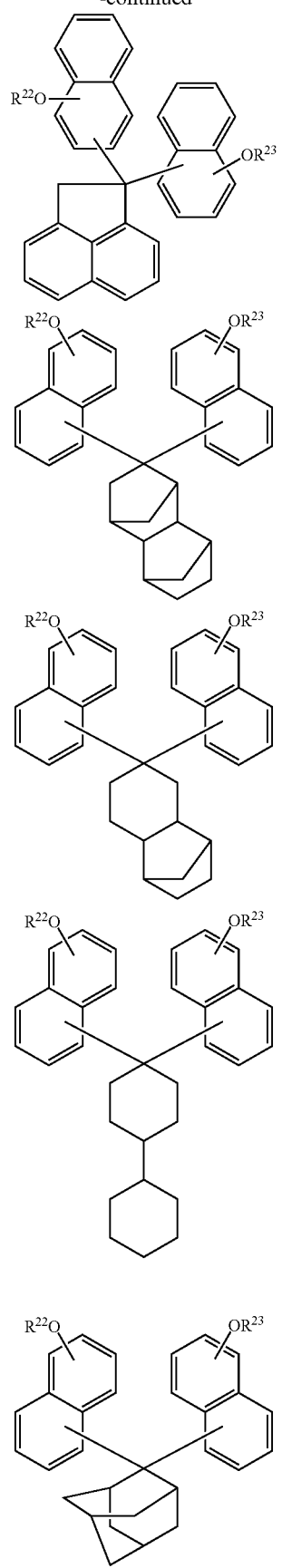

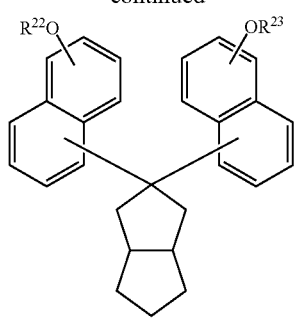
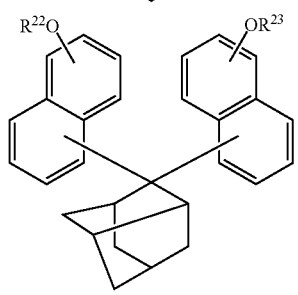
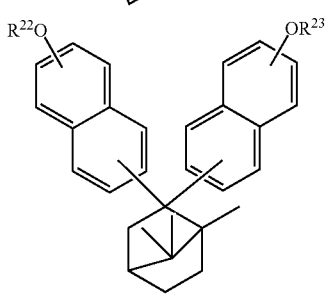
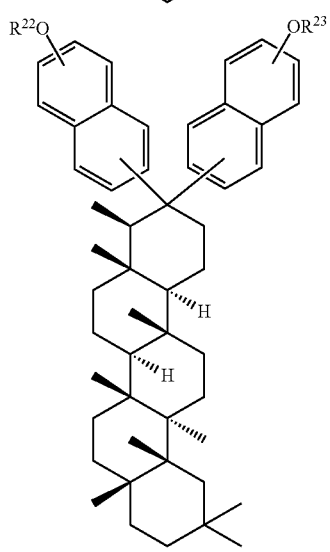
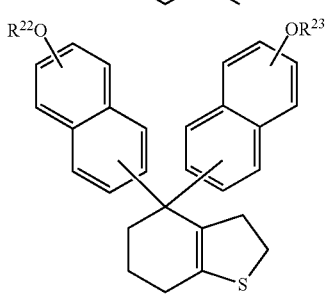
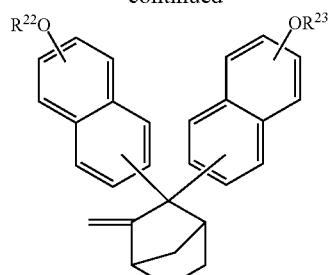
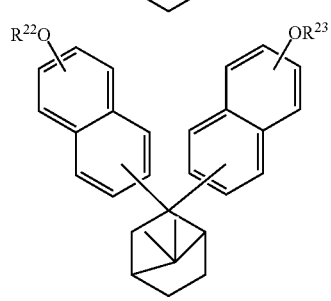
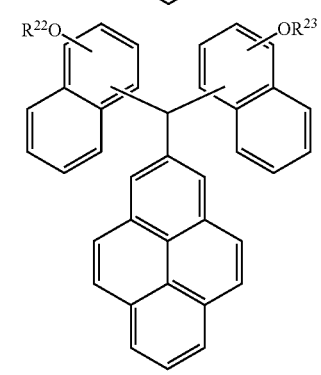
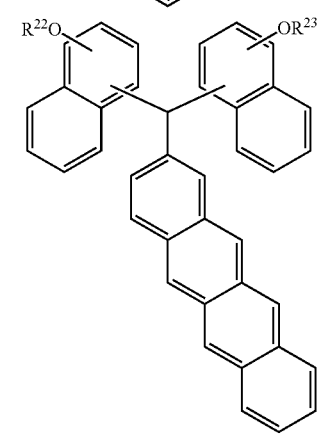
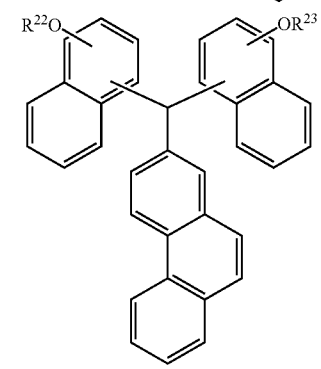

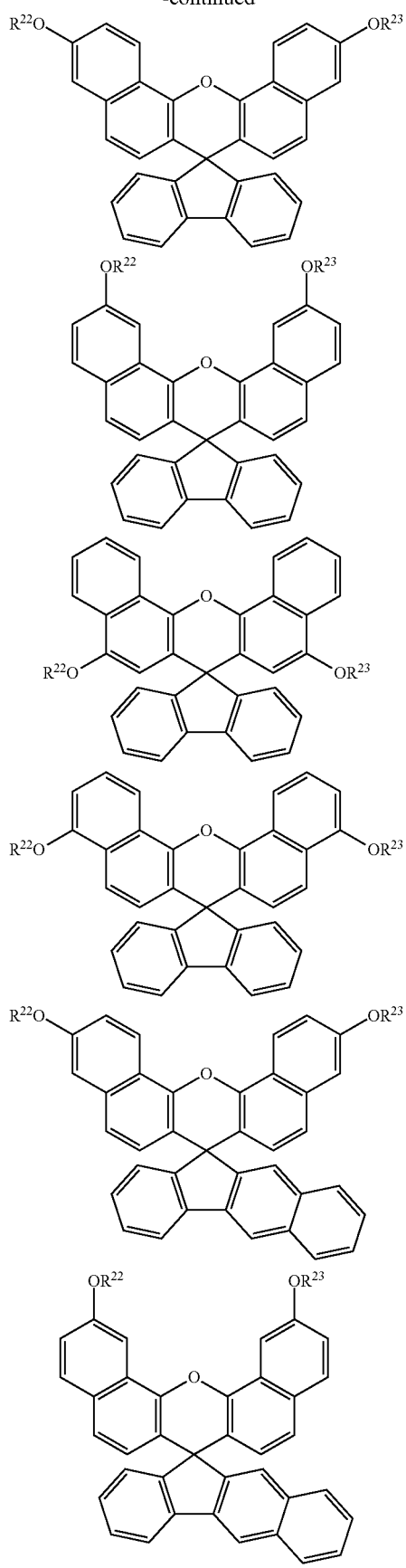
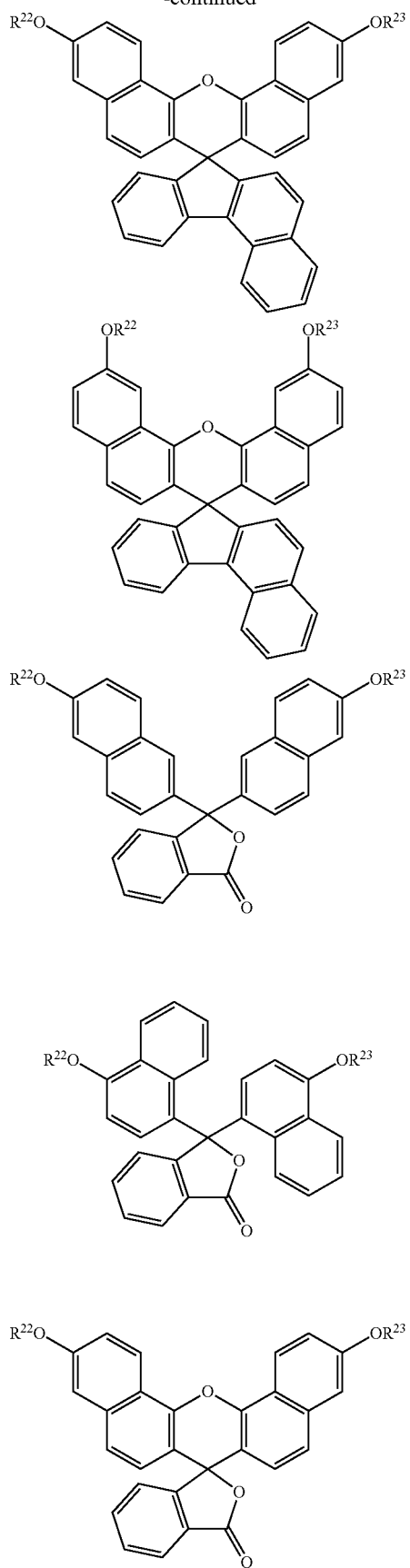

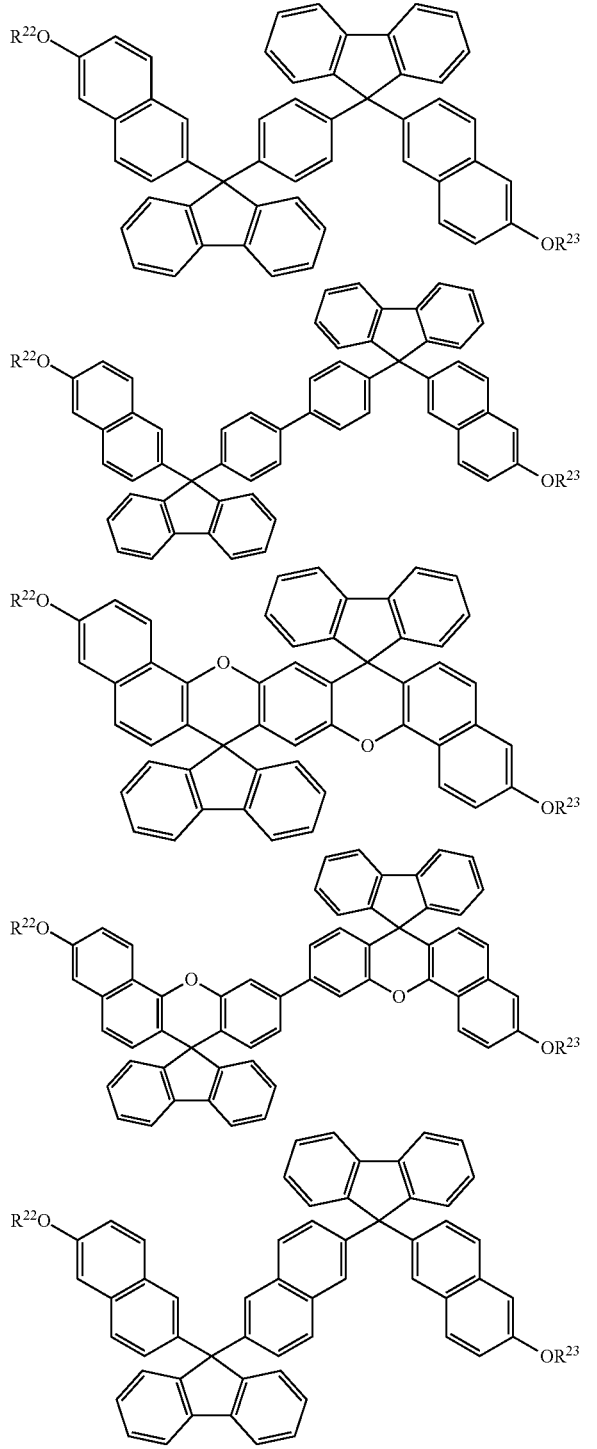

In these formulae, $R^{22}$ represents $R^1$, $R^9$, or $R^{16}$, and $R^{23}$ represents $R^2$, $R^{10}$ or $R^{17}$. The bisnaphthol derivative to give the novolak resin having the repeating unit shown by the formula (1) or (2) may be the same as or different from the bisnaphthol derivative shown by the formula (3) for improving filling property.

When $R^1$, $R^2$, $R^9$, $R^{10}$, $R^{16}$, and $R^{17}$ are acid-labile groups, these groups may be the same or different. Examples thereof include groups shown by the formulae (A-1) to (A-3).

$$—(CH_2)_{A1}—\overset{\displaystyle O}{\underset{}{C}}—O—R^{L30} \quad (A-1)$$

$$—\overset{\displaystyle R^{L31}}{\underset{\displaystyle R^{L32}}{C}}—O—R^{L33} \quad (A-2)$$

$$—\overset{\displaystyle R^{L34}}{\underset{\displaystyle R^{L35}}{C}}—R^{L36} \quad (A-3)$$

In the formula (A-1), $R^{L30}$ represents a tertiary alkyl group having 4 to 20, preferably 4 to 15 carbon atoms, a trialkylsilyl group containing alkyl groups having 1 to 6 carbon atoms, an oxoalkyl group having 4 to 20 carbon atoms, or a substituent shown by the formula (A-3). Illustrative examples of the tertiary alkyl group include a tert-butyl group, a tert-amyl group, a 1,1-diethylpropyl group, a 1-ethylcyclopentyl group, a 1-butylcyclopentyl group, a 1-ethylcyciohexyl group, a 1-butylcyclohexyl group, a 1-ethyl-2-cyclopentenyl group, a 1-ethyl-2-cyclohexenyl group, and a 2-methyl-2-adamantyl group; illustrative examples of the trialkylsilyl group include a trimethylsilyl group, a triethylsilyl group, and a dimethyl-tert-butylsilyl group; and illustrative examples of the oxoalkyl group include a 3-oxocyclohexyl group, a 4-methyl-2-oxooxane-4-yl group, and a 5-methyl-2-oxooxolane-5-yl group. A1 is an integer of 0 to 6.

Illustrative examples of the acid-labile group of the formula (A-1) include a tert-butoxycarbonyl group, a tert-butoxycarbonylmethyl group, a tert-amyloxycarbonyl group, a tert-amyloxycarbonylmethyl group, a 1,1-diethylpropyloxycarbonyl group, a 1,1-diethylpropyloxycarbonyimethyl group, a 1-ethylcyclopentyloxycarbonyl group, a 1-ethylcyclopentyloxycarbonylmethyl group, a 1-ethyl-2-cyclopentenyloxycarbonyl group, a 1-ethyl-2-cyclopentenyloxycarbonylmethyl group, a 1-ethoxyethoxycarbonyimethyl group, a 2-tetrahydropyranyloxycarbonylmethyl group, and a 2-tetrahydrofuranyloxycarbonylmethyl group.

Other examples of the tertiary alkyl group include substituents shown by the formulae (A-1)-1 to (A-1)-10.

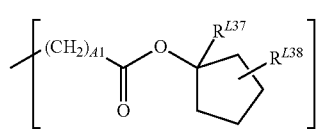

(A-1)-1

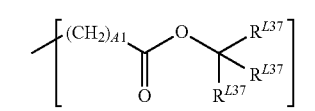

(A-1)-2

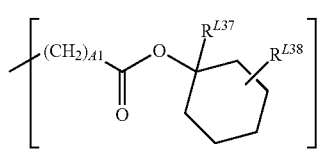

(A-1)-3

-continued

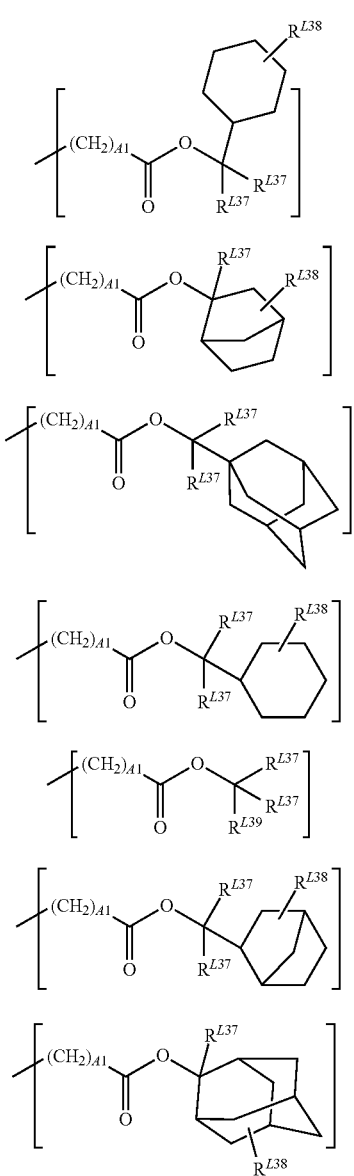

(A-1)-4
(A-1)-5
(A-1)-6
(A-1)-7
(A-1)-8
(A-1)-9
(A-1)-10

In these formulae, each $R^{L37}$ may be the same or different, and represents a linear, branched, or cyclic alkyl group having 1 to 10 carbon atoms or an aryl group having 6 to 17 carbon atoms; $R^{L38}$ represents a hydrogen atom or a linear, branched, or cyclic alkyl group having 1 to 10 carbon atoms; each $R^{L39}$ may be the same or different, and represents a linear, branched, or cyclic alkyl group having 2 to 10 carbon atoms or an aryl group having 6 to 20 carbon atoms; and A1 has the same meaning as above.

In the formula (A-2), $R^{L31}$ and $R^{L32}$ represent a hydrogen atom or a linear, branched, or cyclic alkyl group having 1 to 18, preferably 1 to 10 carbon atoms. Illustrative examples thereof include a methyl group, an ethyl group, a propyl group, an isopropyl group, a n-butyl group, a sec-butyl group, a tert-butyl group, a cyclopentyl group, a cyclohexyl group, a 2-ethylhexyl group, and a n-octyl group. $R^{L33}$ represents a monovalent hydrocarbon group having 1 to 18, preferably 1 to 10 carbon atoms, and optionally containing a heteroatom such as an oxygen atom. For example, there may be mentioned a linear, branched, or cyclic alkyl group and a group in which a part of hydrogen atoms in these groups is substituted with a hydroxyl group, an alkoxy group, an oxo group, an amino group, an alkylamino group, or the like. Illustrative examples thereof include the following substituted alkyl groups.

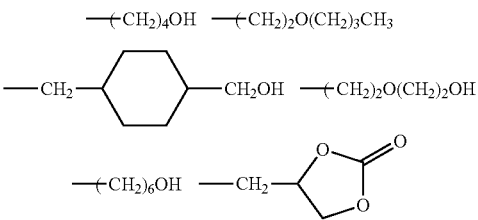

$R^{L31}$ and $R^{L32}$, $R^{L31}$ and $R^{L33}$, and $R^{L32}$ and $R^{L33}$ may be bonded to form a ring together with the carbon atoms to which these groups are bonded; and when the ring is formed, each of $R^{L31}$, $R^{L32}$, and $R^{L33}$ that participate in the ring formation represents a linear or branched alkylene group having 1 to 18, preferably 1 to 10 carbon atoms. The carbon number in the ring is preferably 3 to 10, particularly preferably 4 to 10.

Among the acid-labile group shown by the formula (A-2), illustrative examples of the linear or branched one include groups of the following formulae (A-2)-1 to (A-2)-69.

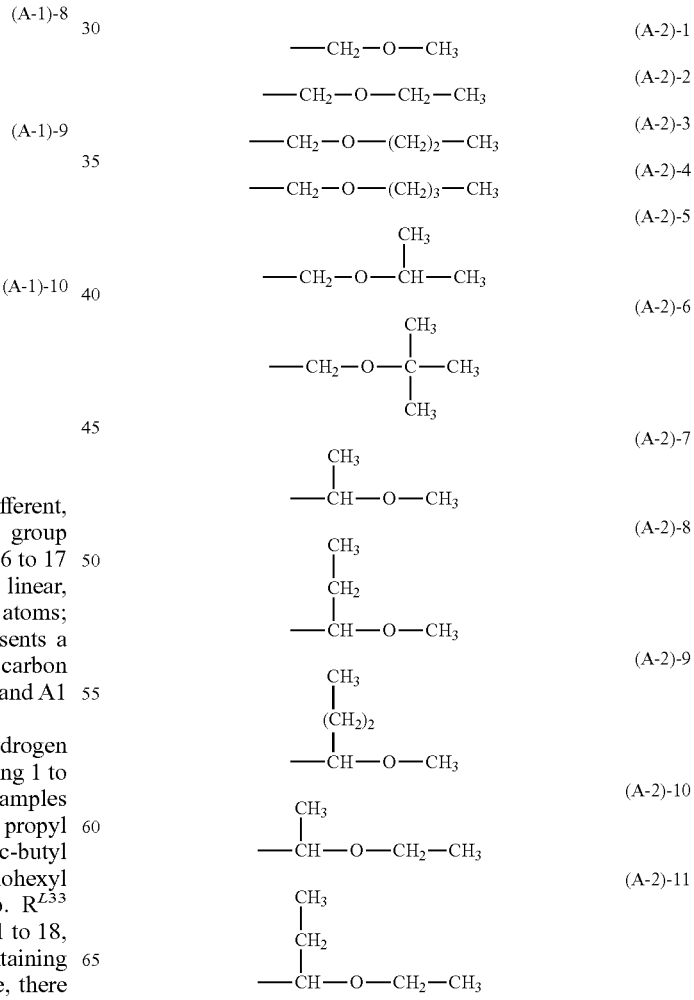

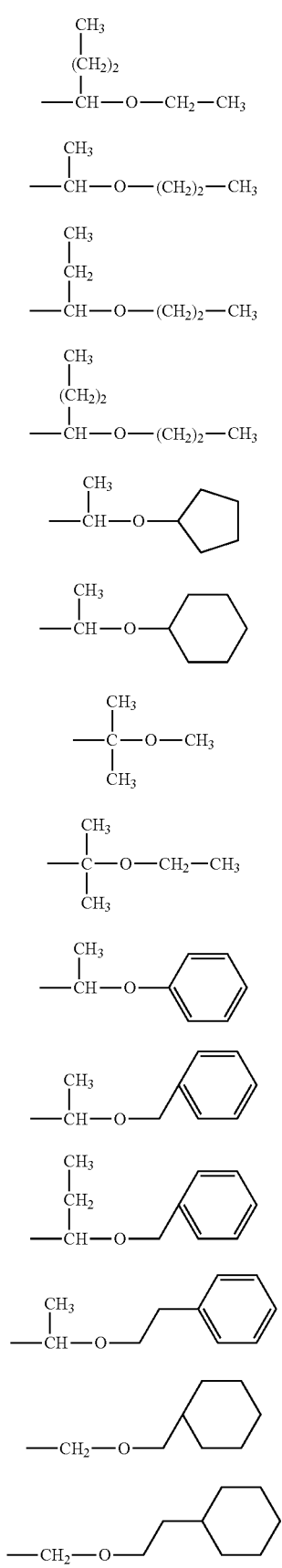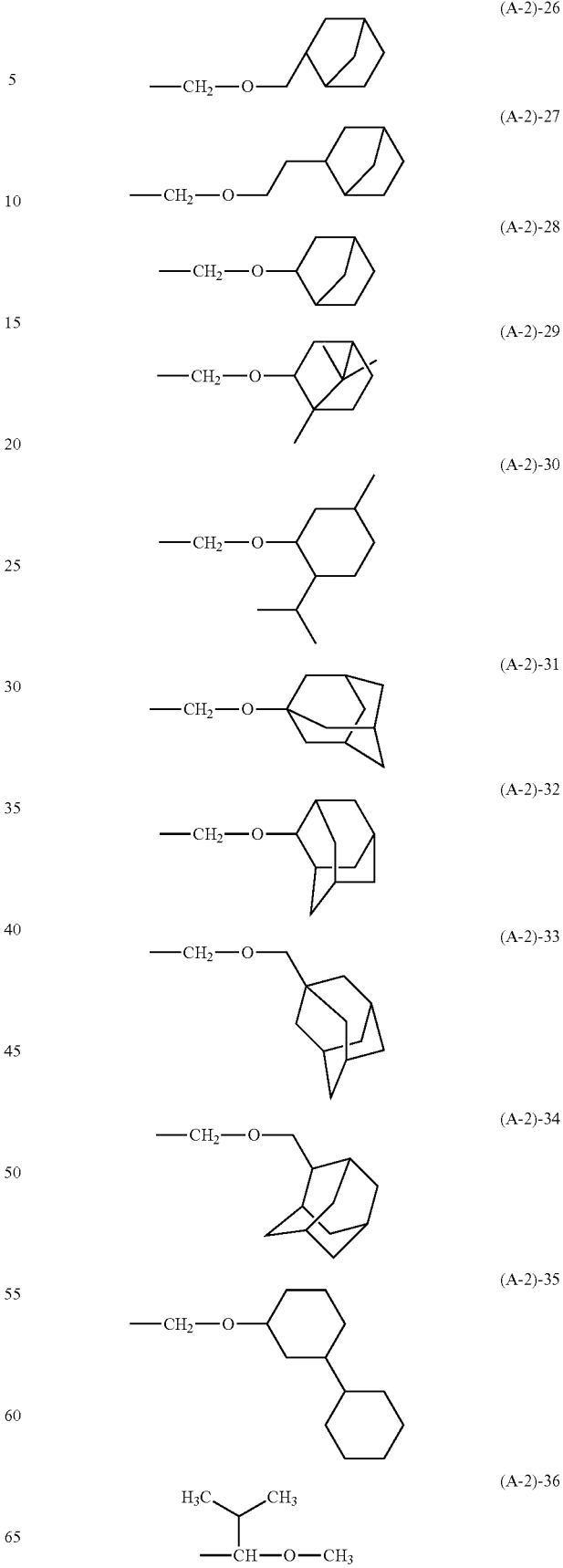

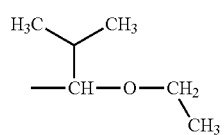 (A-2)-37
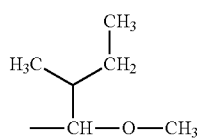 (A-2)-38
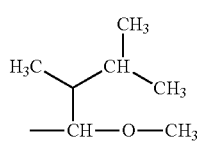 (A-2)-39
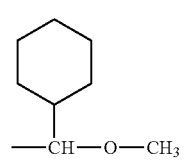 (A-2)-40
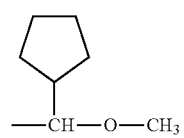 (A-2)-41
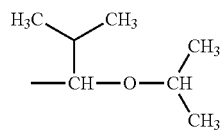 (A-2)-42
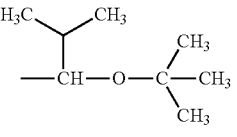 (A-2)-43
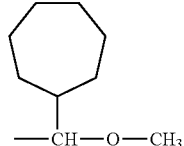 (A-2)-44
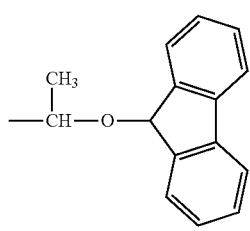 (A-2)-45
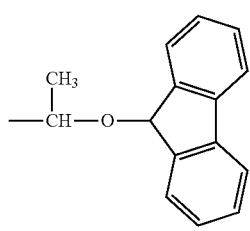 (A-2)-46
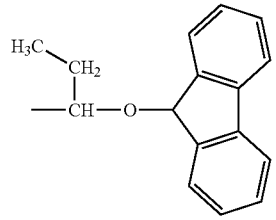 (A-2)-47
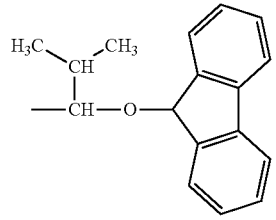 (A-2)-48
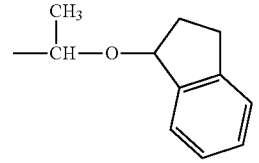 (A-2)-49
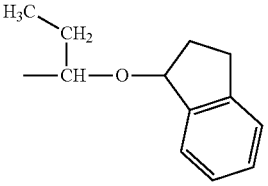 (A-2)-50
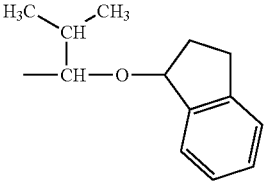 (A-2)-51
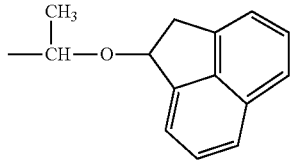 (A-2)-52
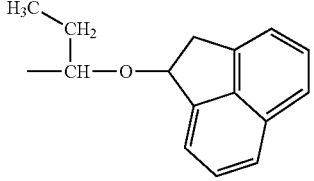 (A-2)-53
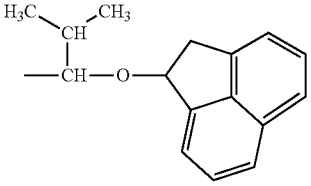 (A-2)-54

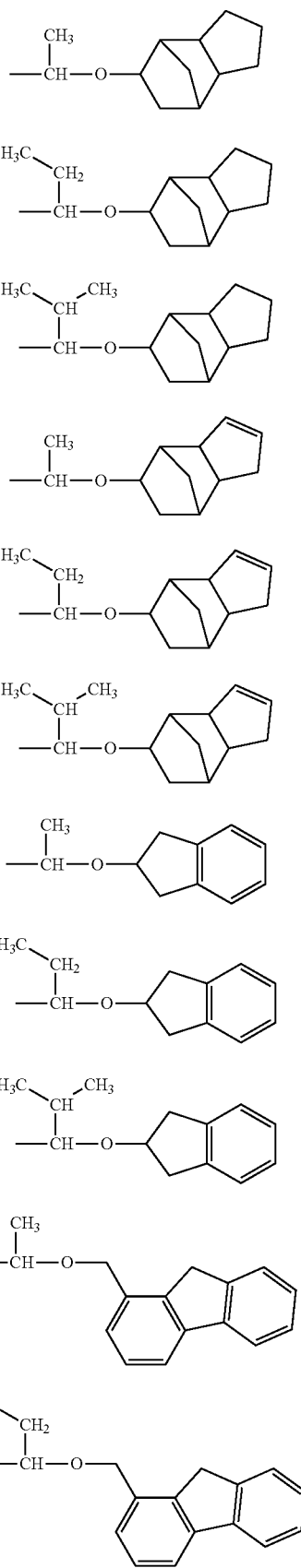
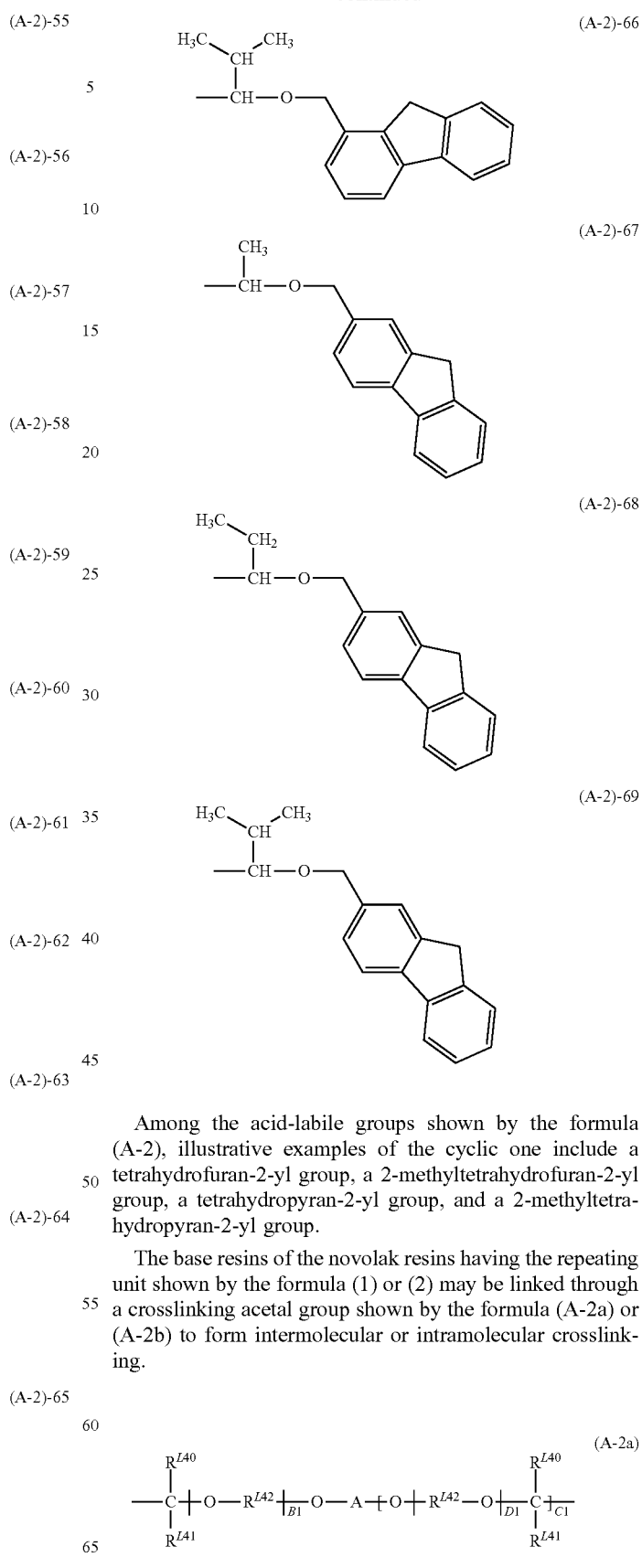

Among the acid-labile groups shown by the formula (A-2), illustrative examples of the cyclic one include a tetrahydrofuran-2-yl group, a 2-methyltetrahydrofuran-2-yl group, a tetrahydropyran-2-yl group, and a 2-methyltetrahydropyran-2-yl group.

The base resins of the novolak resins having the repeating unit shown by the formula (1) or (2) may be linked through a crosslinking acetal group shown by the formula (A-2a) or (A-2b) to form intermolecular or intramolecular crosslinking.

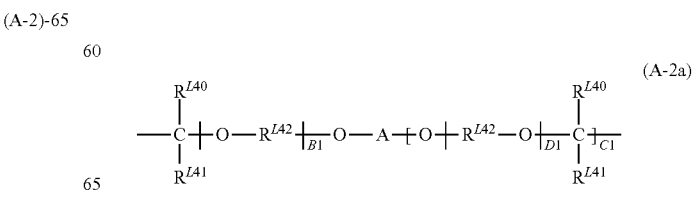

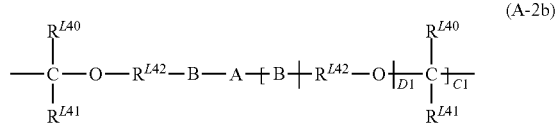
(A-2b)

In these formulae, $R^{L40}$ and $R^{L41}$ represent a hydrogen atom or a linear, branched, or cyclic alkyl group having 1 to 8 carbon atoms. Alternatively, $R^{L40}$ and $R^{L41}$ may be bonded to form a ring together with the carbon atoms to which these groups are bonded. When the ring is formed, $R_{L40}$ and $R^{L41}$ represent a linear or branched alkylene group having 1 to 8 carbon atoms. $R^{L42}$ represents a linear, branched, or cyclic alkylene group having 1 to 10 carbon atoms. B1 and D1 represent an integer of 0 to 10, preferably 0 to 5. C1 represents an integer of 1 to 7, preferably 1 to 3.

In these formulae, "A" represents an aliphatic or alicyclic saturated hydrocarbon group, an aromatic hydrocarbon group, or a heterocyclic group having 1 to 50 carbon atoms with a valency of (C1+1); these groups may contain a heteroatom, or a part of hydrogen atoms bonded to the carbon atom in these groups may be substituted with a hydroxyl group, a carboxyl group, a carbonyl group, or a fluorine atom. "A" is preferably a linear, branched, or cyclic alkylene group, alkyltriyl group, alkyltetrayl group having 2 to 4 valency and 1 to 20 carbon atoms, or an arylene group having 6 to 30 carbon atoms; these group may contain a heteroatom, or a part of hydrogen atoms bonded to the carbon atom in these groups may be substituted with a hydroxyl group, a carboxyl group, an acyl group, or a halogen atom. "B" represents —CO—O—, —NHCO—O—, or —NHCONH—.

Illustrative examples of the crosslinking acetal group shown by the formulae (A-2a) and (A-2b) include groups of the following formulae (A-2)-70 to (A-2)-77.

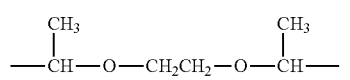
(A-2)-70

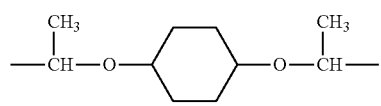
(A-2)-71

(A-2)-72

(A-2)-73

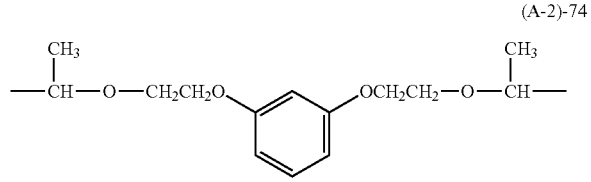
(A-2)-74

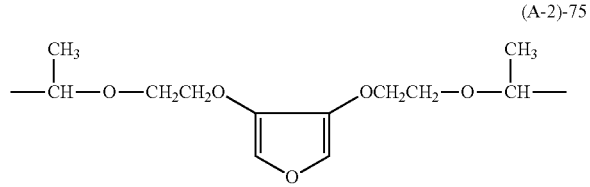
(A-2)-75

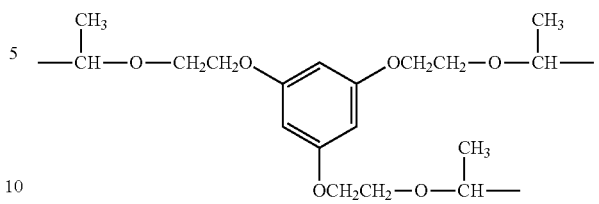
(A-2)-76

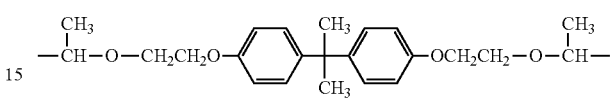
(A-2)-77

In these formula (A-3), $R^{L34}$, $R^{L35}$, and $R^{L36}$ represent a monovalent hydrocarbon group such as a linear, branched, or cyclic alkyl group having 1 to 20 carbon atoms or a linear, branched, or cyclic alkenyl group having 2 to 20 carbon atoms. These groups may contain a heteroatom such as oxygen, sulfur, nitrogen, and fluorine. $R^{L34}$ and $R^{L35}$, $R^{L34}$ and $R^{L36}$, and $R^{L35}$ and $R^{L36}$ may be bonded to form an aliphatic ring having 3 to 20 carbon atoms together with the carbon atoms to which these groups are bonded.

Illustrative examples of the tertiary alkyl group shown by the formula (A-3) include a tert-butyl group, a triethylcarbyl group, a 1-ethylnorbornyl group, a 1-methylcyclohexyl group, a 1-ethylcyclopentyl group, a 2-(2-methyl)adamantyl group, a 2-(2-ethyl)adamantyl group, and a tert-amyl group.

Other examples of the tertiary alkyl group include groups of the formulae (A-3)-1 to (A-3)-18.

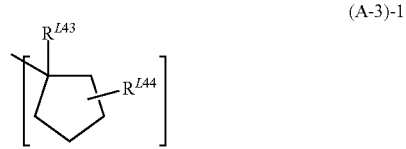
(A-3)-1

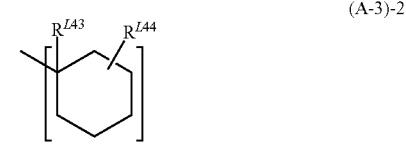
(A-3)-2

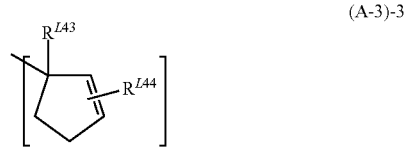
(A-3)-3

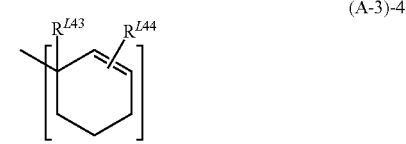
(A-3)-4

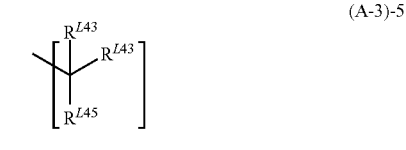
(A-3)-5

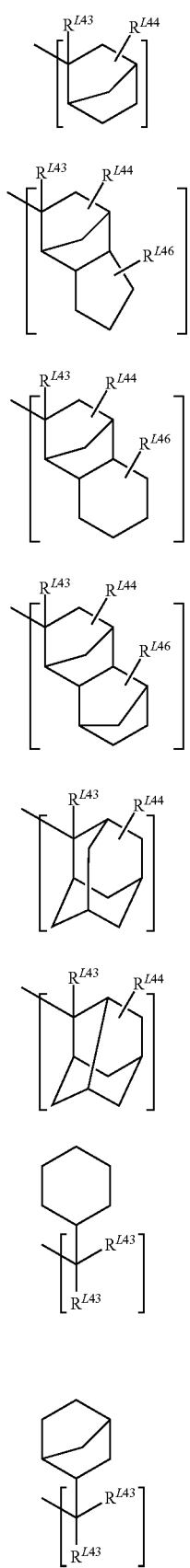
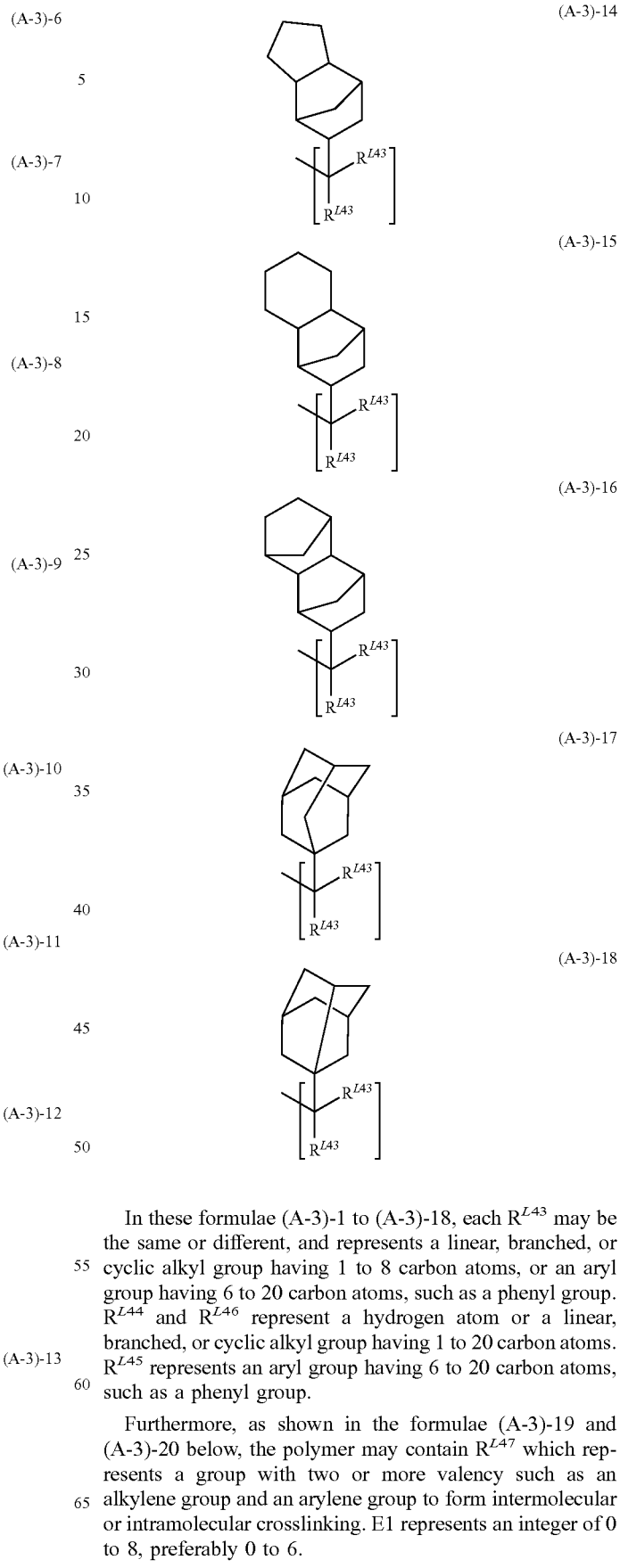

In these formulae (A-3)-1 to (A-3)-18, each $R^{L43}$ may be the same or different, and represents a linear, branched, or cyclic alkyl group having 1 to 8 carbon atoms, or an aryl group having 6 to 20 carbon atoms, such as a phenyl group. $R^{L44}$ and $R^{L46}$ represent a hydrogen atom or a linear, branched, or cyclic alkyl group having 1 to 20 carbon atoms. $R^{L45}$ represents an aryl group having 6 to 20 carbon atoms, such as a phenyl group.

Furthermore, as shown in the formulae (A-3)-19 and (A-3)-20 below, the polymer may contain $R^{L47}$ which represents a group with two or more valency such as an alkylene group and an arylene group to form intermolecular or intramolecular crosslinking. E1 represents an integer of 0 to 8, preferably 0 to 6.

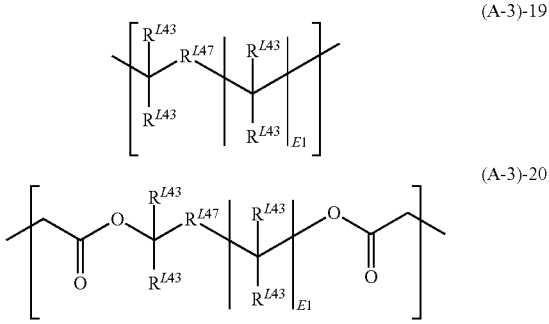

(A-3)-19

(A-3)-20

The novolak resin having the repeating unit shown by the formula (1) or (2) may be a co-condensate of a monomer other than the above-described bisnaphthol derivative. Illustrative examples of the monomer usable in co-condensation include phenol, o-cresol, m-cresol, p-cresol, 2,3-dimethylphenol, 2,4-dimethylphenol, 2,5-dimethylphenol, 2,6-dimethylphenol, 3,4-dimethylphenol, 3,5-dimethylphenol, 2,3,5-trimethylphenol, 3,4,5-trimethylphenol, 2-tert-butylphenol, 3-tert-butylphenol, 4-tert-butylphenol, 2-phenylphenol, 3-phenylphenol, 4-phenylphenol, 3,5-diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-tert-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-tert-butyl-5-methylphenol, pyrogallol, thymol, isothymol, 4,4'-(9H-fluoren-9-ylidene)bisphenol, 2,2'-dimethyl-4,4'-(9H-fluoren-9-ylidene)bisphenol, 2,2'-diallyl-4,4'-(9H-fluoren-9-ylidene)bisphenol, 2,2'-difluoro-4,4'-(9H-fluoren-9-ylidene)bisphenol, 2,2'-diphenyl-4,4'-(9H-fluoren-9-ylidene)bisphenol, 2,2'-dimethoxy-4,4'-(9H-fluoren-9-ylidene)bisphenol, 2,3,2',3'-tetrahydro-(1,1')-spirobiindene-6,6'-diol, 3,3,3',3'-tetramethyl-2,3,2',3'-tetrahydro-(1,1')-spirobiindene-6,6'-diol, 3,3,3',3',4,4'-hexamethyl-2,3,2',3'-tetrahydro-(1,1')-spirobiindene-6,6'-diol, 2,3,2',3'-tetrahydro-(1,1')-spirobiindene-5,5'-diol, 5,5'-dimethyl-3,3,3',3'-tetramethyl-2,3,2',3'-tetrahydro-(1,1')-spirobiindene-6,6'-diol, 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 1,8-dihydroxynaphthalene, 2,3-dihydroxynaphthalene, 2,4-dihydroxynaphthalene, 2,5-dihydroxynaphthalene, 2,6-dihydroxynaphthalene, 2,7-dihydroxynaphthalene, 2,8-dihydroxynaphthalene, 1-naphthol, 2-naphthol, 2-methyl-1-naphthol, 4-methoxy-1-naphthol, 7-methoxy-2-naphthol, 6-methoxy-2-naphthol, 3-methoxy-2-naphthol, 1,4-dimethoxynaphthalene, 1,5-dimethoxynaphthalene, 1,6-dimethoxynaphthalene, 1,7-dimethoxynaphthalene, 1,8-dimethoxynaphthalene, 2,3-dimethoxynaphthalene, 2,6-dimethoxynaphthalene, 2,7-dimethoxynaphthalene, methyl 3-hydroxy-naphthalene-2-carboxylate, naphthalene, 1-methylnaphthalene, 2-methylnaphthalene, 1,2-dimethylnaphthalene, 1,3-dimethylnaphthalene, 1,4-dimethylnaphthalene, 1,5-dimethylnaphthalene, 1,6-dimethylnaphthalene, 1,7-dimethylnaphthalene, 1,8-dimethylnaphthalene, 2,3-dimethylnaphthalene, 2,6-dimethylnaphthalene, 2,7-dimethylnaphthalene, 1-ethylnaphthalene, 2-ethylnaphthalene, 1-propylnaphthalene, 2-propylnaphthalene, 1-butylnaphthalene, 2-butylnaphthalene, 1-phenylnaphthalene, 1-cyclohexylnaphthalene, 1-cyclopentylnaphthalene, indene, hydroxyanthracene, acenaphthylene, acenaphthene, biphenyl, bisphenol, trisphenol, dicyclopentadiene, substituted or unsubstituted phenolphthalein, phenol red, cresolphthalein, cresol red, thymolphthalein, 2-fluorophenol, 3-fluorophenol, 4-fluorophenol, 4-trifluoromethylphenol, 2,3-difluorophenol, 2,4-difluorophenol, 2,5-difluorophenol, 2,6-difluorophenol, 3,4-difluorophenol, 3,5-difluorophenol, 2,3,4-trifluorophenol, 2,3,6-trifluorophenol, 3,4,5-trifluorophenol, 2-trifluoromethoxyphenol, 3-trifluoromethoxyphenol, 4-trifluoromethoxyphenol, 2-trifluoromethylthiophenol, 3-trifluoromethylthiophenol, 4-trifluoromethylthiophenol, 2,3-ditrifluorophenol, 2,4-ditrifluorophenol, 2,5-ditrifluorophenol, 2,6-ditrifluorophenol, 3,4-ditrifluorophenol, 3,5-ditrifluorophenol, pentafluorophenol, 3-trifluoromethylphenol, 2-trifluoromethylphenol, 4-(1,1,1,3,3,3-hexafluoro-2-propanol)phenol, 3-(1,1,1,3,3,3-hexafluoro-2-propanol)phenol, and 3,5-di(1,1,1,3,3,3-hexafluoro-2-propanol) phenol.

To synthesize the novolak resin having the repeating unit shown by the formula (1) or (2), optional monomers and aldehyde are added to the above-described substituted or unsubstituted bisnaphthol derivative and polymerized to form a novolak. Forming a novolak increases the molecular weight, thus enabling the inhibition of generation of outgas and particles due to low molecular weight components at baking.

The novolak resin having the repeating unit shown by the formula (1) is synthesized with an aldehyde having one or more fluorine atoms. Illustrative examples of the aldehyde having one or more fluorine atoms include 2-fluorobenzaldehyde, 3-fluorobenzaldehyde, 4-fluorobenzaldehyde, 3-fluorsalicylaldehyde, 4-flucrosalicylaidehyde, 5-fluorosalicylaldehyde, 6-fluorosalicylaldehyde, 2,3-difluorobenzaldehyde, 3-fluoro-p-anisaldehyde, 4-fluoro-m-anisaldehyde, 6-fluoropicolinaldehyde, 3,4-difluorobenzaldehyde, 2,4-difluorobenzaldehyde, 3,5-difluorobenzaldehyde, 2,6-difluorobenzaldehyde, 2,3,4-trifluorobenzaldehyde, 3,4,5-trifluorobenzaldehyde, 2,3,5,6-tetrafluorobenzaldehyde, 2,3,4,5-tetrafluorobenzaldehyde, 2,3,4,5,6-pentafluorobenzaldehyde, 2,3,5,6-tetrafluoro-4-hydroxybenzaldehyde, 2,3,5,6-tetrafluoro-4-methoxybenzaldehyde, 2,3,5,6-tetrafluoro-4-ethoxybenzaldehyde, 2,3,5,6-tetrafluoro-4-tert-butoxybenzaldehyde, 2-trifluoromethylbenzaldehyde, 3-trifluoromethylbenzaldehyde, 4-trifluoromethylbenzaldehyde, 2,4-bistrifluoromethylbenzaldehyde, 2,5-bistrifluoromethylbenzaldehyde, 3,5-bistrifluoromethyl-benzaldehyde, 2,6-bistrifluoromethylbenzaldehyde, 2-trifluoromethoxybenzaldehyde, 3-trifluoromethoxy-benzaldehyde, 4-trifluoromethoxybenzaldehyde, 2-trifluoromethylthiobenzaldehyde, 3-trifluoromethylthiobenzaldehyde, 4-trifluoromethylthiobenzaldehyde, 4-difluoromethoxybenzaldehyde, 2-(1,1,1,3,3,3-hexafluoro-2-propanol)benzaldehyde, 3-(1,1,1,3,3,3-hexafluoro-2-propanol)benzaldehyde, 4-(1,1,1,3,3,3-hexafluoro-2-propanol)benzaldehyde, 2,4-bis(1,1,1,3,3,3-hexafluoro-2-propanol)benzaldehyde, 3,5-bis(1,1,1,3,3,3-hexafluoro-2-(propanol) benzaldehyde, fluoroacetaldehyde, difluoroacetaldehyde, trifluoroacetaldehyde, 2-fluoroethylaldehyde, 2,2,2,3,3,3-pentafluoropropylaldehyde, 3-fluoropropylaldehyde, 4-fluorobutylaldehyde, 3,3,3-trifluoropropylaldehyde, 4,4,4-trifluorobutylaldehyde, 2-(trifluoromethyl)propionaldehyde, and heptafluorobutylaldehyde.

The novolak resin having the repeating unit shown by the formula (2) is synthesized with an aldehyde having no fluorine atom. Examples thereof include formaldehyde, trioxane, paraformaldehyde, benzaldehyde, methoxybenzaldehyde, phenylbenzaldehyde, tritylbenzaldehyde, cyclohexylbenzaldehyde, cyclopentyibenzaldehyde, tert-butylbenzaldehyde, naphthalenealdehyde, hydroxynaphthalenealdehyde, anthracenealdehyde, fluorenealdehyde, pyrenealdehyde, methoxynaphthalenealdehyde, dimethoxynaphthalenealdehyde, acetaldehyde, propylaldehyde, phenylacetaldehyde, naphthaleneacetaldehyde, substituted or unsubstituted carboxylnaphthaleneacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, furancarboxaldehyde, and thiophenealdehyde. Among them, formaldehyde is particularly preferable.

The aldehydes can be used alone or in combination of two or more kinds. The amount of the aldehyde having fluorine atom or the aldehyde having no fluorine atom to be used is preferably 0.2 to 5 mol, more preferably 0.5 to 2 mol with respect to 1 mol of the substituted or unsubstituted bisnaphthol derivative.

A catalyst may be used in condensation reaction of the bisnaphthol derivative with the aldehyde having fluorine atom or the aldehyde having no fluorine atom. Illustrative examples thereof include acid catalysts such as hydrochloric acid, nitric acid, sulfuric acid, formic acid, oxalic acid, acetic acid, methanesulfonic acid, camphor sulfonic acid, tosic acid, and trifluoromethane sulfonic acid. The amount of the acid catalyst to be used is preferably in the range of $1 \times 10^{-5}$ to $5 \times 10^{-1}$ mol with respect to 1 mol of the bisnaphthol derivative.

The novolak resins having the repeating unit shown by the formula (1) or (2) preferably have a weight average molecular weight in the range of 400 to 20,000, more preferably 500 to 10,000, particularly preferably 600 to 10,000. A resin having smaller molecular weight is excellent in filling property, but easy to generate outgas in baking. Thus, it is preferable to optimize the molecular weight in view of filling property and generation of outgas.

The inventive resist under layer film composition preferably contains the novolak resin having the repeating unit shown by the formula (2) and the bisnaphthol derivative shown by the formula (3) in a total amount of 5 to 10000 parts by mass with respect to 100 parts by mass of the novolak resin having the repeating unit shown by the formula (1). Such a ratio enables the reduction in outgas by a resin layer of the novolak resin having the repeating unit shown by the formula (1) and the improvement in filling property by the bisnaphthol derivative shown by the formula (3) to be achieved with particularly good balance.

The inventive resist under layer film composition contains the novolak resin having the repeating unit shown by the formula (1) and preferably either or both of the novolak resin having the repeating unit shown by the formula (2) and the bisnaphthol derivative shown by the formula (3). In addition to these novolak resins, other resin may be blended to the composition. Examples of the blendable resin include novolak resins obtained by reaction of aldehyde with phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-tert-butylphenol, 3-tert-butylphenol, 4-tert-butylphenol, 2-phenylphenol, 3-phenylphenol, 4-phenylphenol, 3,5-diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-tert-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-tert-butyl-5-methylphenol, pyrogallol, thymol, isothymol, 1-naphthol, 2-naphthol, 2-methyl-1-naphthol, 4-methoxy-1-naphthol, 7-methoxy-2-naphthol, dihydroxynaphthalene such as 1,5-dihydroxynaphthalene, 1,7-dihydroxynaphthalene, and 2,6-dihydroxynaphthalene, phenolphthalein, phenol red, cresolphthalein, cresol red, thymolphthalein, methyl 3-hydroxynaphthalene-2-carboxylate, indene, hydroxyindene, benzofuran, hydroxyanthracene, acenaphthylene, biphenyl, bisphenol, or trisphenol. Other examples include resins obtained by co-condensation of a phenol compound with dicyclopentadiene, tetrahydroindene, 4-vinylcyclohexene, norbornadiene, 5-vinylnorborna-2-ene, α-pinene, β-pinene, or limonene, without aldehyde.

Furthermore, as a monomer component other than the bisnaphthol derivative shown by the formula (3), a compound selected from hydroxystyrene, alkoxystyrene, hydroxyvinylnaphthalene, alkoxyvinylnaphthalene, (meth) acrylate, vinylether, maleic anhydride, and itaconic anhydride may be added. A compound such as substituted or unsubstituted naphthol may also be added.

The inventive resist under layer film composition may further contain a high-carbon resin. Examples of the resin include resins used in a resist under layer film composition disclosed in Japanese Patent Laid-Open Publication No. 2004-205658, No. 2004-205676, No. 2004-205685, No. 2004-271838, No. 2004-354554, No. 2005-010431, No. 2005-049810, No. 2005-114921, No. 2005-128509, No. 2005-250434, No. 2006-053543, No. 2006-227391, No. 2006-259249, No. 2006-259482, No. 2006-285095, No. 2006-293207, No. 2006-293298, No. 2007-140461, No. 2007-171895, No. 2007-199653, No. 2007-316282, No. 2008-026600, No. 2008-065303, No. 2008-096684, No. 2008-257188, No. 2010-160189, No. 2010-134437, No. 2010-170013, No. 2010-271654, No. 2008-116677, and No. 2008-145539.

(Organic Solvent)

The inventive resist under layer film composition may further contain an organic solvent. The organic solvent usable in the inventive resist under layer film composition is not limited so long as it can dissolve a base resin of the above-described novolak resin or other resin, monomer components, and additives such as an acid generator and a crosslinking agent described later. Specifically, solvents disclosed in paragraphs (0091) and (0092) of Japanese Patent Laid-Open Publication No. 2007-199653 may be added.

(Crosslinking Agent)

The resist under layer film requires characteristics that when a silicon-containing middle layer film composition or a resist upper layer film composition is dispensed to the resist under layer film, the resist under layer film does not dissolve in the silicon-containing middle layer film composition or the resist upper layer film composition and does not mix with the silicon-containing middle layer film or the resist upper layer film. Therefore, a crosslinking agent is preferably added to the inventive resist under layer film composition to promote crosslinking by baking after the application.

Examples of the crosslinking agent usable in the present invention include a melamine compound, a guanamine compound, a glycoluril compound, a urea compound, an epoxy compound, an isocyanate compound, or an azide compound that is substituted with at least one group selected from a methylol group, an alkoxymethyl group, and acyloxymethyl group; and a compound having a double bond such as an alkenyl ether group. These compounds may be used as an additive, or may be introduced as a pendant group into a side chain of the polymer. A compound containing a hydroxyl group may also be used as the crosslinking agent.

Illustrative examples of the crosslinking agent include epoxy compounds such as tris(2,3-epoxypropyl)isocyanurate, trimethylolmethane triglycidyl ether, trimethylolpropane triglycidyl ether, and triethylolethane triglycidyl ether; melamine compounds such as hexamethylol melamine, hexamethoxymethyl melamine, a hexamethylol melamine compound in which 1 to 6 methylol groups are methoxymethylated, a mixture thereof, hexamethoxyethyl melamine, hexaacyloxymethyl melamine, and a hexamethylol melamine compound in which 1 to 6 methylol groups are acyloxymethylated, and a mixture thereof; guanamine compounds such as tetramethylol guanamine, tetramethoxymethyl guanamine, a tetramethylol guanamine compound in which 1 to 4 methylol groups are methoxymethylated, a mixture thereof, tetramethoxyethyl guanamine, tetraacyloxy guanamine, a tetramethylol guanamine compound in which 1 to 4 methylol groups are acyloxymethylated, and a mixture thereof; glycoluril compounds such as tetramethylol glycoluril, tetramethoxy glycoluril, tetramethoxymethyl glycoluril, a tetramethylol glycoluril compound in which 1 to 4 methylol groups are methoxymethylated, a mixture thereof, a tetramethylol glycoluril compound in which 1 to 4 methylol groups are acyloxymethylated, and a mixture thereof; urea compounds such as tetramethylol urea, tetramethoxymethyl urea, a tetramethylol urea compound in which 1 to 4 methylol groups are methoxymethylated, a mixture thereof, and tetramethoxyethyl urea; isocyanate compounds such as tolylene diisocyanate, diphenylmethane diisocyanate, hexamethylene diisocyanate, and cyclohexane diisocyanate; and azide compounds such as 1,1'-biphenyl-4,4'-bisazide, 4,4'-methylidene bisazide, and 4,4'-oxybisazide.

As the crosslinking agent for forming crosslinking by an acetal group, there may be mentioned a compound having multiple enolether groups within the molecule. Examples of the crosslinking agent having at least two enolether groups within the molecule include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylolpropane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, ethylene glycol dipropenyl ether, triethylene glycol dipropenyl ether, 1,2-propanediol dipropenyl ether, 1,4-buthanedisol dipropenyl ether, tetramethylene glycol dipropenyl ether, neopentyl glycol dipropenyl ether, trimethylol propane tripropenyl ether, hexanediol dipropenyl ether, 1,4-cyclohexanediol dipropenyl ether, pentaerythritol tripropenyl ether, pentaerythritol tetrapropenyl ether, sorbitol tetrapropenyl ether, and sorbitol pentapropenyl ether.

In addition, following compounds may be mentioned as the crosslinking agent of the compound having multiple enolether groups within the molecule.

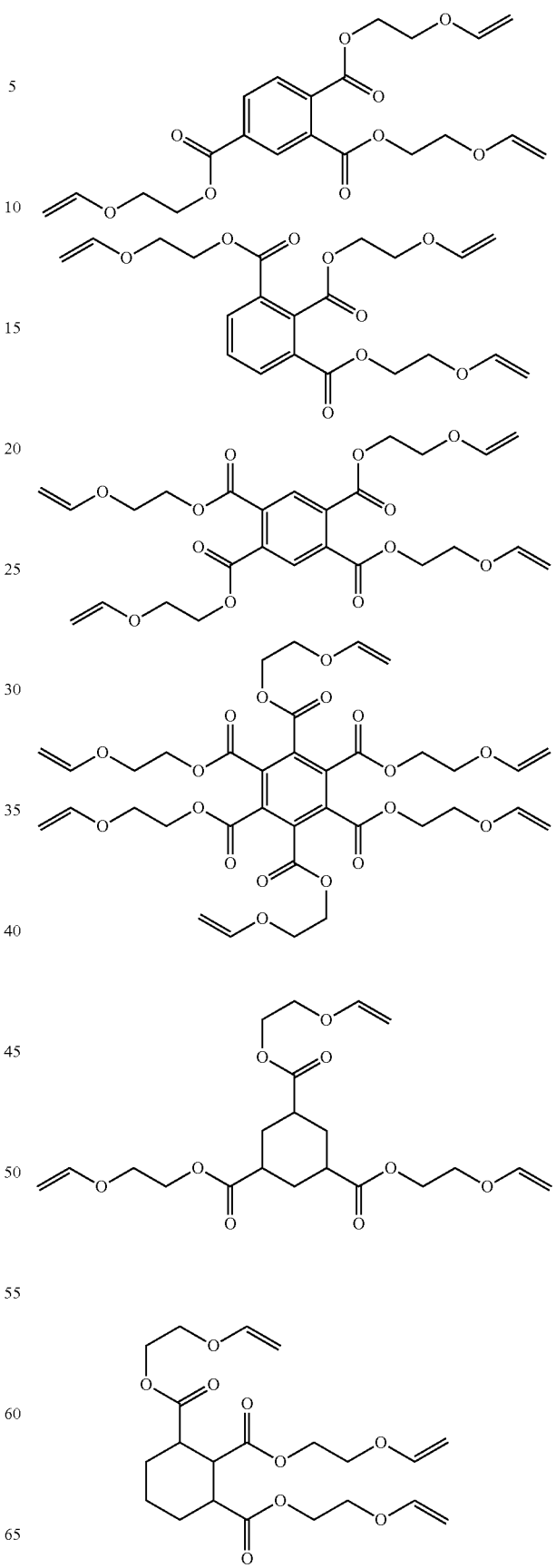

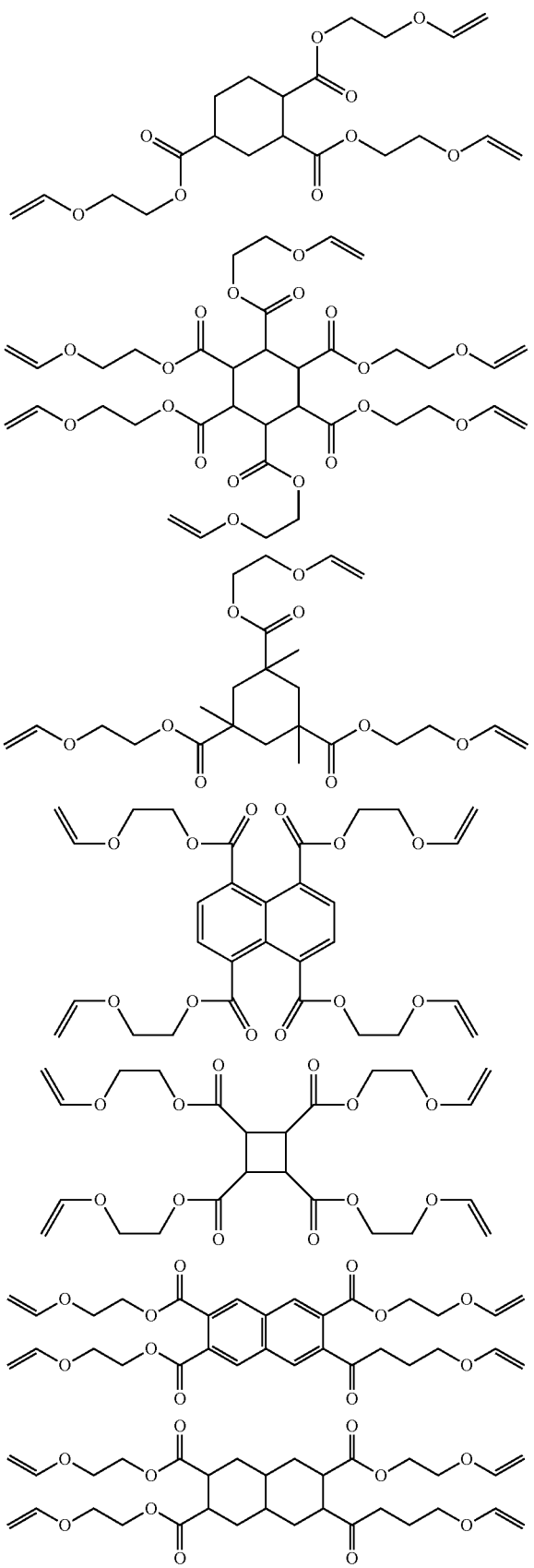

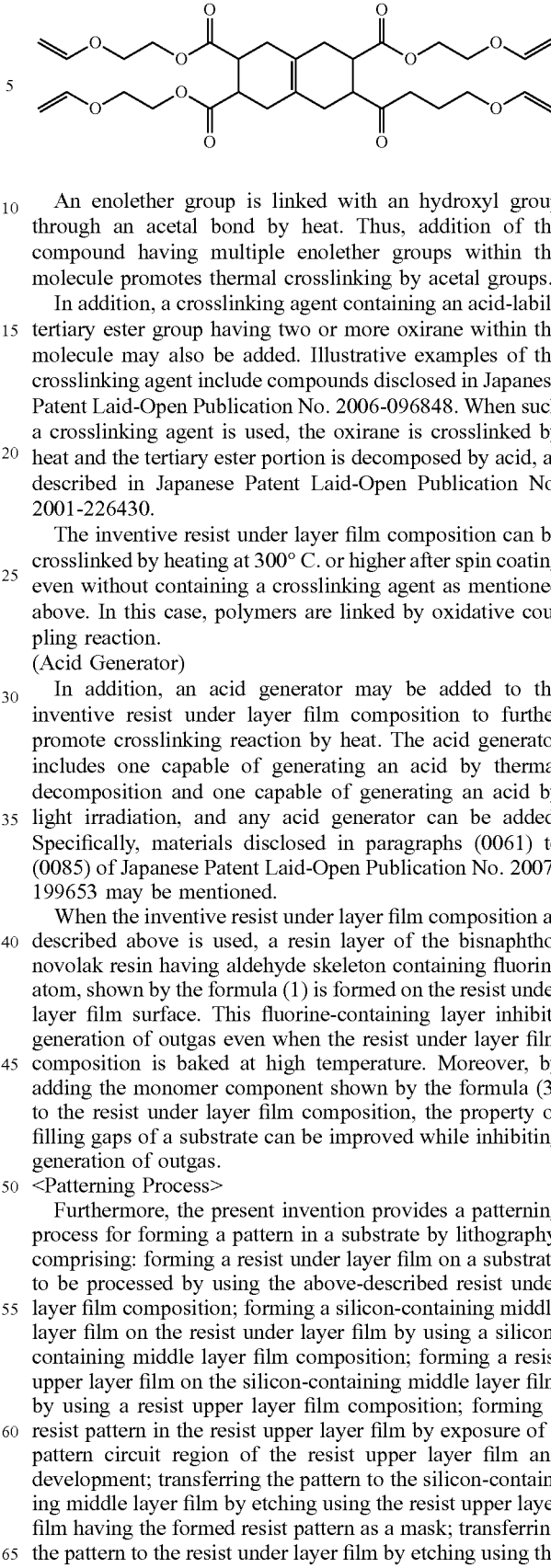

An enolether group is linked with an hydroxyl group through an acetal bond by heat. Thus, addition of the compound having multiple enolether groups within the molecule promotes thermal crosslinking by acetal groups.

In addition, a crosslinking agent containing an acid-labile tertiary ester group having two or more oxirane within the molecule may also be added. Illustrative examples of the crosslinking agent include compounds disclosed in Japanese Patent Laid-Open Publication No. 2006-096848. When such a crosslinking agent is used, the oxirane is crosslinked by heat and the tertiary ester portion is decomposed by acid, as described in Japanese Patent Laid-Open Publication No. 2001-226430.

The inventive resist under layer film composition can be crosslinked by heating at 300° C. or higher after spin coating even without containing a crosslinking agent as mentioned above. In this case, polymers are linked by oxidative coupling reaction.

(Acid Generator)

In addition, an acid generator may be added to the inventive resist under layer film composition to further promote crosslinking reaction by heat. The acid generator includes one capable of generating an acid by thermal decomposition and one capable of generating an acid by light irradiation, and any acid generator can be added. Specifically, materials disclosed in paragraphs (0061) to (0085) of Japanese Patent Laid-Open Publication No. 2007-199653 may be mentioned.

When the inventive resist under layer film composition as described above is used, a resin layer of the bisnaphthol novolak resin having aldehyde skeleton containing fluorine atom, shown by the formula (1) is formed on the resist under layer film surface. This fluorine-containing layer inhibits generation of outgas even when the resist under layer film composition is baked at high temperature. Moreover, by adding the monomer component shown by the formula (3) to the resist under layer film composition, the property of filling gaps of a substrate can be improved while inhibiting generation of outgas.

<Patterning Process>

Furthermore, the present invention provides a patterning process for forming a pattern in a substrate by lithography, comprising: forming a resist under layer film on a substrate to be processed by using the above-described resist under layer film composition; forming a silicon-containing middle layer film on the resist under layer film by using a silicon-containing middle layer film composition; forming a resist upper layer film on the silicon-containing middle layer film by using a resist upper layer film composition; forming a resist pattern in the resist upper layer film by exposure of a pattern circuit region of the resist upper layer film and development; transferring the pattern to the silicon-containing middle layer film by etching using the resist upper layer film having the formed resist pattern as a mask; transferring the pattern to the resist under layer film by etching using the silicon-containing resist middle layer film having the transferred pattern as a mask; forming the pattern in the substrate to be processed by etching using the resist under layer film having the transferred pattern as a mask.

Hereinafter, examples of the inventive patterning process will be described with reference to drawings, but the present invention is not limited thereto.

FIG. 1 is a flow chart showing an example of the inventive patterning process by 3-layer process using a silicon-containing middle layer film. In the patterning process shown in the flow chart of FIG. 1, first, I-i) the inventive resist under layer film composition is applied onto a layer to be processed 2 on a substrate 1 to form a resist under layer film 3, a silicon-containing middle layer film composition is applied onto the resist under layer film 3 to form a silicon-containing middle layer film 4, and a resist upper layer film composition is applied onto the silicon-containing middle layer film 4 to form a resist upper layer film 5. Then, I-ii) a pattern circuit region 6 of the resist upper layer film 5 is exposed to light, and I-iii) development is performed to form a resist pattern in the resist upper layer film 5 (in the case of positive resist). I-iv) The pattern is transferred to the silicon-containing middle layer film 4 by etching using the resist upper layer film 5 having the formed resist pattern as a mask. I-v) The pattern is transferred to the resist under layer film 3 by etching using the silicon-containing middle layer film 4 having the transferred pattern as a mask. I-vi) The pattern is formed in the layer to be processed 2 by etching using the resist under layer film 3 having the transferred pattern as a mask.

[Substrate to be Processed]

The substrate to be processed may be, but is not limited to, a substrate on which a layer to be processed is formed. The substrate is not limited, and a material such as Si, α-Si, p-Si, $SiO_2$, SiN, SiON, W, TiN, and Al, and a different material from the layer to be processed is preferably used. The layer to be processed is preferably made of Si, $SiO_2$, SiON, SiN, p-Si, α-Si, W, W—Si, Al, Cu, Al—Si, or the like; and various low dielectric constant (low-k) films, etching stopper films thereof, and a substrate with gaps for Fin-FET are preferably used. The layer to be processed is preferably formed with a thickness of 10 to 10,000 nm, particularly 20 to 5,000 nm.

A hard mask for processing the substrate may be formed between the substrate to be processed and the resist under layer film. When the substrate to be processed is a $SiO_2$ insulator film substrate, SiN, SiON, p-Si, α-Si, W, W—Si, amorphous carbon or the like is used as the hard mask. When the substrate to be processed is a gate electrode such as p-Si, W—Si, and Al—Si, $SiO_2$, SiN, SiON or the like is used.

A suitable middle layer film on the resist under layer film formed from the inventive resist under layer film composition contains an element selected from silicon, titanium, zirconium, and hafnium. A tri-layer process in which a resist upper layer film is formed on this middle layer film is preferable. The most preferable element contained in the middle layer film for the tri-layer is silicon.

[Silicon-Containing Middle Layer Film]

The silicon-containing middle layer film composition may include, though not limited to, a silsesquioxane-based material having absorption at the exposure wavelength as disclosed in Japanese Patent Laid-Open Publication No. 2007-302873. The silicon-containing middle layer film may be formed by spin coating. After spin coating, the silicon-containing middle layer film composition is baked at 150 to 300° C. to form a silicon-containing middle layer film composed of a silicon oxide film.

The best optical constants (n- and k-values) of the silicon-containing middle layer film to be used in the tri-layer process for antireflection effect is as follows: the n-value is 1.5 to 1.9; the k-value is 0.15 to 0.3; the film thickness is 20 to 130 nm. Moreover, the best resist under layer film has a n-value of 1.3 to 1.8, a k-value of 0.2 to 0.8, and a film thickness of 50 nm or more.

[Resist Upper Layer Film]

The resist upper layer film composition may contain, though not limited to, a known base polymer mainly consisting of hydrocarbon, as disclosed in Japanese Patent Laid-Open Publication No. H09-073173 and No. 2000-336121. The thickness of the resist upper layer film is preferably, but not limited to, 20 to 500 nm, particularly 30 to 400 nm.

The spin coating method is suitable to form the resist upper layer film from the resist upper layer film composition, as in the case that the resist under layer film is formed. After the resist upper layer film is formed by spin coating or other method, pre-baking is performed preferably at 80 to 180° C. for 10 to 300 seconds.

Figure 2:
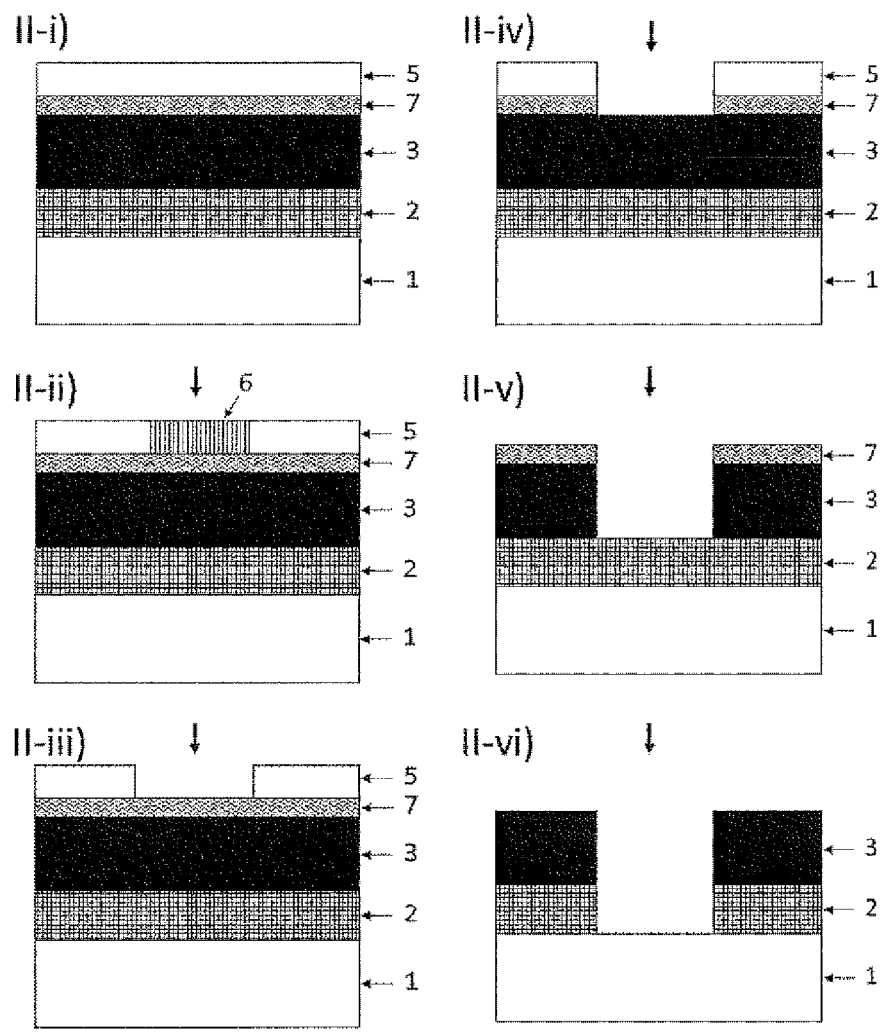
FIG. 2 is a flow chart showing an example of the inventive patterning process by 3-layer process using an inorganic hard mask intermediate film.

When an inorganic hard mask intermediate film is formed instead of the silicon-containing middle layer film, as shown in II-i) of FIG. 2, an inorganic hard mask intermediate film 7 selected from a silicon oxide film, a silicon nitride film, a silicon oxynitride film, a silicon carbide film, a polysilicon film, a titanium nitride film, a titanium oxide film, a titanium carbide film, a zirconium oxide film, and a hafnium oxide film may be formed between the resist under layer film 3 and the resist upper layer film 5.

[Inorganic Hard Mask Intermediate Film]

The inorganic hard mask intermediate film composition is not limited. An inorganic hard mask intermediate film containing an element selected from metals such as silicon, titanium, zirconium, and hafnium may be used. In particular, as to the titanium-containing intermediate film, materials disclosed in Japanese Patent Laid-Open Publication No. 2014-178602 may be used. The tri-layer process can be done by forming an inorganic hard mask intermediate film on a resist under layer film and forming a resist upper layer film thereon. In particular, p-Si, SiN, SIGN, SiC, TiN, $TiO_2$, TiC, $ZrO_2$, and $HfO_2$ are preferable as the inorganic hard mask intermediate film material.

The inorganic hard mask intermediate film can be formed by, for example, the CVD method, the ALD method, or the sputtering method. In the film formation, the material is heated at 300 to 800° C. Therefore, it is preferred to previously heat the resist under layer film at 300 to 800° C. to prevent generation of outgas from the resist under layer film during the CVD method or the sputtering method. At this time, if a large amount of outgas is generated, the outgas adheres to a top plate above a hot plate and causes defects by dropping onto the wafer surface. As mentioned above, however, the inventive resist under layer film composition can inhibit generation of outgas in baking at high temperature. Thus, this composition is usable even when an inorganic hard mask intermediate film is formed.

Figure 3:
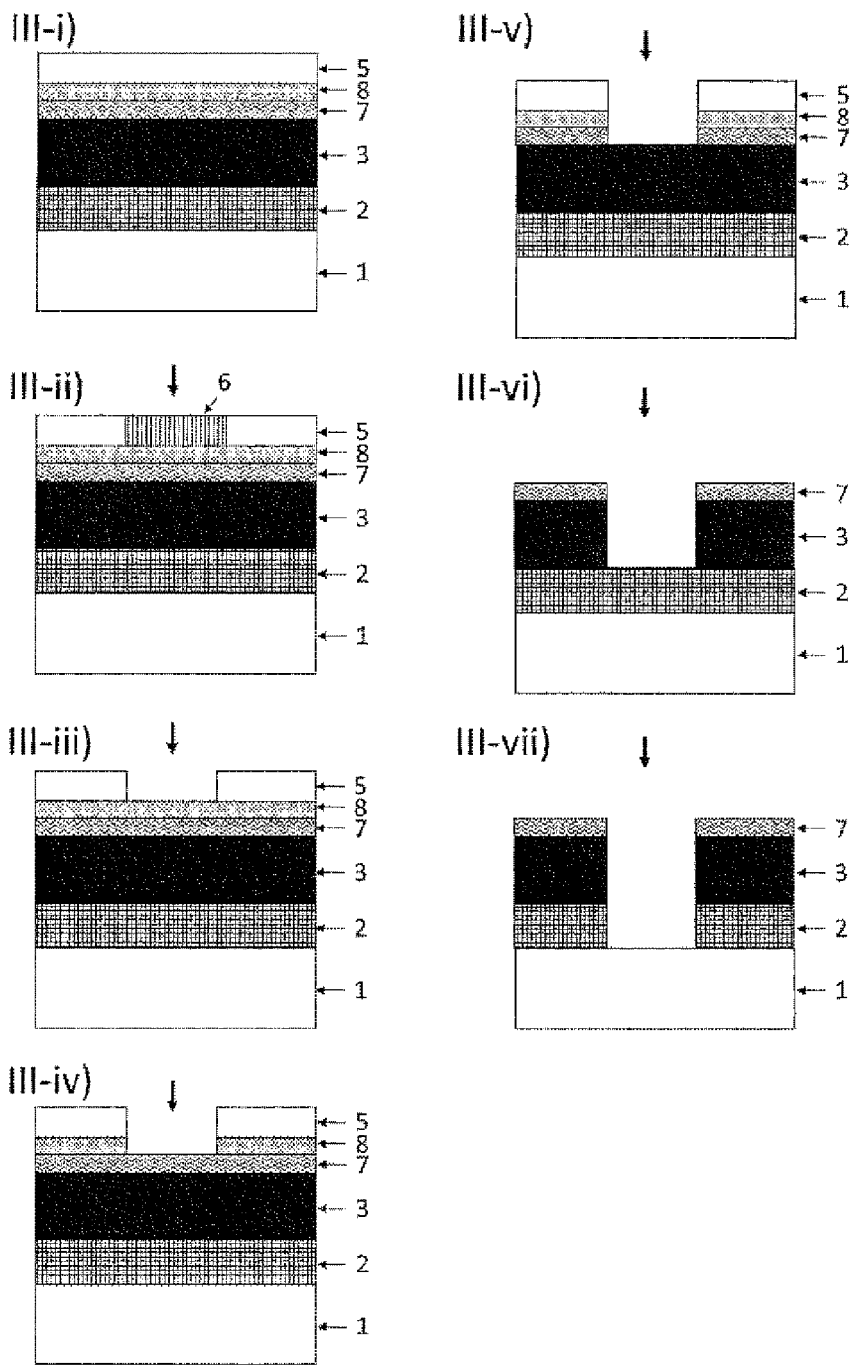
FIG. 3 is a flow chart showing an example of the inventive patterning process by 4-layer process.

In the case of a 4-layer resist film in which an organic antireflection film is formed on the inorganic hard mask intermediate film, an organic antireflection film composition may be applied onto the inorganic hard mask intermediate film 7 to form an organic antireflection film 8, as shown in III-i) of FIG. 3. This case is called 4-layer process.

[Organic Antireflection Film]

The organic antireflection film composition is not limited, and any known material can be used.

Figure 4:
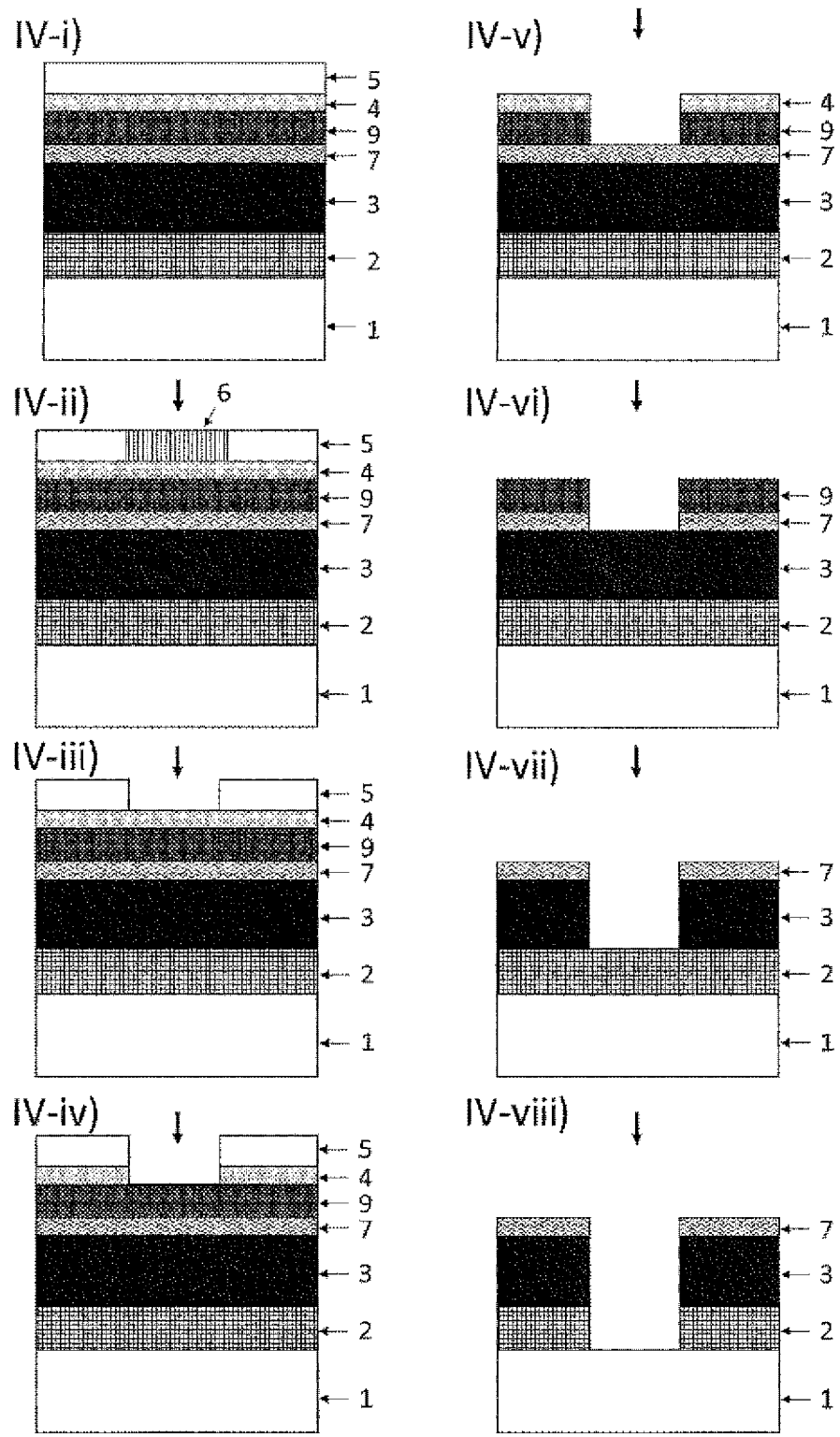
FIG. 4 is a flow chart showing an example of the inventive patterning process by 5-layer process.

In the case of a 5-layer resist film in which a hydrocarbon film is formed and an silicon-containing middle layer film is formed thereon, a hydrocarbon film 9 is formed on the inorganic hard mask intermediate film 7 from a hydrocarbon film composition by spin coating, and a silicon-containing middle layer film 4 is formed thereon from a silicon-containing middle layer film composition, as shown in IV-i) of FIG. 4. This case is called 5-layer process.

The hydrocarbon film composition is not limited, and any known materials can be used.

[Pattern Formation]
(3-Layer Process)

First, a method for forming a resist under layer film by using the inventive resist under layer film composition will be described. The film can be formed on a substrate by spin coating or other method, in the same manner as in the conventional method for forming a photoresist film. The resist under layer film composition is applied onto the above-described substrate to be processed by spin coating or other method to form a resist under layer film. Then, baking is preferably performed to evaporate the organic solvent, prevent mixing with a resist upper layer film, or promote crosslinking reaction. The baking temperature is preferably at 80 to 800° C. for 10 to 300 seconds. The thickness of the resist under layer film is appropriately determined, and it is preferred to set 5 to 100,000 nm, particularly 10 to 50,000 nm. The above range of thickness provides high antireflection effect.

In the case of the 3-layer process, as shown in I-i) of FIG. 1, a resist under layer film 3 is formed on a layer to be processed 2 laminated on a substrate 1, a silicon-containing middle layer film 4 is formed thereon, and a resist upper layer film 5 is formed thereon.

In addition, a resist top coat may be formed on the resist upper layer film. The resist top coat is often formed for the purpose of preventing elution of additives such as an acid generator from the resist upper layer film and improving water-sliding property in the liquid immersion exposure. The resist top coat may have antireflection function. The resist top coat can be classified into water-soluble one and water-insoluble one. The water-insoluble resist top coat is further classified into a material that is soluble in an alkali developer and a material that is insoluble in an alkali developer and removable with an organic solvent. The former is preferable because of process advantage that the top coat can be removed at the time of development of the resist. In the case of forming a negative pattern by organic solvent development, the latter solvent-removable top coat can be removed at the time of development. When the top coat is soluble in an alkali developer, a solution in which a polymer having α-trifluoromethylhydroxyl group is dissolved in a higher alcohol having 4 or more carbon atoms or an ether compound having 8 to 12 carbon atoms is used.

As to the method for forming the resist top coat, a top coat composition is applied onto the resist upper layer film by spin coating after prebaking. The film thickness of the resist top coat is preferably 10 to 200 nm. After drying or liquid immersion exposure, post exposure baking (PEB) is performed, followed by development with an alkali developer for 10 to 300 seconds. Usually, a 2.38 mass % tetramethylammonium hydroxide aqueous solution is widely used as the alkali developer. When a resist top coat soluble in the developer is used, removal of the resist top coat and development of the resist upper layer film can be performed at the same time.

A resist pattern of the resist upper layer film can be formed according to the conventional method. A resist pattern can be obtained by exposure of a pattern circuit region of the resist upper layer film, PEB, and development. When a silicon-containing middle layer film which contains a polymer having silicon-containing acid-labile pendants and an acid generator is used, the resist pattern and a pattern of the silicon-containing middle layer film can be obtained at the same time by exposure and development.

Here, if water remains on the resist upper layer film before PEB, the water absorbs acid in the resist upper layer film during PEB, impeding pattern formation. To fully remove water on the resist top coat before PEB, water on the film is preferably dried or recovered by suitable means, for example, spin drying prior to PEB, purging of the film surface with dry air or nitrogen, or optimizing the water recovery nozzle configuration or process on a stage after the exposure.

First, a pattern circuit region 6 of the resist upper layer film 5 is exposed (FIG. 1, I-ii)), and PEB and development are carried out to form a resist pattern in the resist upper layer film 5 (FIG. 1, I-iii)). By using the obtained resist patter as a mask, the silicon-containing middle layer film 4 is etched with CF-based gas to transfer the pattern to the silicon-containing middle layer film 4 (FIG. 1, I-iv)).

The development is carried out by, for example, the puddle method or the dip method with an alkali aqueous solution. In particular, the puddle method with a 2.38 mass % tetramethylammonium hydroxide aqueous solution is preferable. The film is treated with an developer at room temperature for 10 seconds to 300 seconds, then rinsed with pure water and dried by spin drying, nitrogen blowing or other method. The exposed part is dissolved by alkali development in the case of positive resist, or insolubilized in the case of negative resist.

A negative pattern can also be formed by organic solvent development. The solvent to be used in this development is one or more solvents selected from 2-octanone, 2-nonanone, 2-heptanone, 3-heptanone, 4-heptanone, 2-hexanone, 3-hexanone, diisobutylketone, methylcyclohexanone, acetophenone, methylacetophenone, propyl acetate, butyl acetate, isobutyl acetate, amyl acetate, butenyl acetate, isoamyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxy-isobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

Then, the pattern is transferred to the resist under layer film 3 by dry etching with oxygen plasma or the like (FIG. 1, I-v)) using the resist pattern and the pattern of the silicon-containing middle layer film as a mask. The resist under layer film formed from the inventive resist under layer film composition is preferably dry etched with an etching gas containing an oxygen gas or a hydrogen gas. In addition to the oxygen gas or hydrogen gas, an inert gas such as He and Ar or a gas such as $CO$, $CO_2$, $NH_3$, $SO_2$, $N_2$, and $NO_2$ may be added.

Moreover, it is preferred that the resist upper layer film composition do not contain a polymer having a silicon atom, and the etching of the resist under layer film be performed with an etching gas containing an oxygen gas or a hydrogen gas. Use of such an etching gas enables the removal of the resist upper layer film and the etching of the resist under layer film to be performed at the same time.

Once the pattern of the silicon-containing middle layer film is removed, the layer to be processed 2 is etched by using the pattern of the resist under layer film as a mask to form the pattern (FIG. 1, I-vi). Here, when the layer to be processed 2 is made of $SiO_2$ or SiN, an etching gas containing fluorocarbon-based gas is preferable, and when the layer is made of polysilicon (p-Si), Al, or W, an etching gas containing chlorine-based gas or bromine-based gas is preferable. If ions are implanted, the substrate to be processed does not necessarily need to be processed, and the ions are implanted by using the pattern of the resist under layer film as a mask.

FIG. 2 shows an example of the tri-layer patterning process of the present invention in which an inorganic hard mask intermediate film is formed. In the patterning process shown by the flow chart of FIG. 2, II-i) the inventive resist under layer film composition is applied onto a layer to be processed 2 on a substrate 1 to form a resist under layer film 3, an inorganic hard mask intermediate film composition is applied onto the resist under layer film 3 to form an inorganic hard mask intermediate film 7, a resist upper layer film composition is applied onto the inorganic hard mask intermediate film 7 to form a resist upper layer film 5. II-ii) A pattern circuit region 6 is then exposed to light, and II-iii) development is conducted to form a resist pattern in the resist upper layer film 5 (in the case of positive resist). II-iv) The pattern is transferred to the inorganic hard mask intermediate film 7 by etching using the resist upper layer film 5 having the formed resist pattern as a mask. II-v) The pattern is transferred to the resist under layer film 3 by etching using the inorganic hard mask intermediate film 7 having the transferred pattern as a mask, and II-vi) the pattern is formed in the layer to be processed 2 by etching using the resist under layer film 3 having the transferred pattern as a mask. In this process, the etching of the inorganic hard mask intermediate film may be carried out according to the conventional method.

(4-Layer Process)

Next, the inventive patterning process by 4-layer process will be described. In the patterning process shown in the flow chart of FIG. 3, III-i) the inventive resist under layer film composition is applied onto a layer to be processed 2 on a substrate 1 to form a resist under layer film 3, an inorganic hard mask intermediate film composition is applied onto the resist under layer film 3 to form an inorganic hard mask intermediate film 7, an organic antireflection film composition is applied onto the inorganic hard mask intermediate film 7 to form an organic antireflection film 8, and a resist upper layer film composition is applied onto the organic antireflection film 8 to form a resist upper layer film 5, thereby forming a 4-layer resist film. III-ii) A pattern circuit region 6 is then exposed to light, and III-iii) development is conducted to form a resist pattern in the resist upper layer film 5 (in the case of positive resist). III-iv) The pattern is transferred to the organic antireflection film 8 by etching using the resist upper layer film 5 having the formed resist pattern as a mask. III-v) The pattern is transferred to the inorganic hard mask intermediate film 7 by etching using the organic antireflection film 8 having the transferred pattern as a mask. III-vi) The pattern is transferred to the resist under layer film 3 by etching using the inorganic hard mask intermediate film 7 having the transferred pattern as a mask, and III-vii) the pattern is formed in the layer to be processed 2 by etching using the resist under layer film 3 having the transferred pattern as a mask.

In this process, the etching of the organic antireflection film may be carried out according to the conventional method. The etching of the organic antireflection film and the inorganic hard mask intermediate film 7 may be carried out successively, or after the organic antireflection film 8 is etched alone, an etching apparatus may be changed to etch the inorganic hard mask intermediate film 7 (FIG. 3, III-iv), III-v)).

(5-Layer Process)

Next, the inventive patterning process by 5-layer process will be described. In the patterning process shown in the flow chart of FIG. 4, IV-i) the inventive resist under layer film composition is applied onto a layer to be processed 2 on a substrate 1 to form a resist under layer film 3, an inorganic hard mask intermediate film composition is applied onto the resist under layer film 3 to form an inorganic hard mask intermediate film 7, a hydrocarbon film 9 is formed the inorganic hard mask intermediate film 7 by spin coating with a hydrocarbon film composition, a silicon-containing middle layer film 4 is formed on the hydrocarbon film 9 by using a silicon-containing middle layer film composition, and a resist upper layer film composition is applied onto the silicon-containing middle layer film 4 to form a resist upper layer film 5, thereby forming a 5-layer resist film. IV-ii) A pattern circuit region 6 is then exposed to light, and IV-iii) development is conducted to form a resist pattern in the resist upper layer film 5 (in the case of positive resist). IV-iv) The pattern is transferred to the silicon-containing middle layer film 4 by etching using the resist upper layer film 5 having the formed resist pattern as a mask. IV-v) The pattern is transferred to the hydrocarbon film 9 by etching using the silicon-containing middle layer film 4 having the transferred pattern as a mask. IV-vi) The pattern is transferred to the inorganic hard mask intermediate film 7 by etching using the hydrocarbon film 9 having the transferred pattern as a mask. IV-vii) The pattern is transferred to the resist under layer film 3 by etching using the inorganic hard mask intermediate film 7 having the transferred pattern as a mask, and IV-viii) the pattern is formed in the layer to be processed 2 by etching using the resist under layer film 3 having the transferred pattern as a mask. In this process, the etching of the hydrocarbon film may be carried out according to the conventional method.

As mentioned above, the inventive patterning process using the inventive resist under layer film composition allows a substrate to be sufficiently embedded, prevents generation of outgas, and thus significantly reduces defects at fine processing in the manufacturing process of a semiconductor apparatus and the like. Accordingly, the resist under layer film composition and the patterning process of the present invention are especially suitable for manufacturing a three-dimension device such as Fin-FET, which requires filling a trench pattern having narrow pitch and the inhibiting generation of outgas during baking of the resist under layer film that may cause defects.

EXAMPLES

Hereinafter, the present invention will be specifically explained with reference to examples and comparative examples, but the present invention is not limited thereto.

Synthesis of Novolak Resin Having Repeating Unit Shown by Formula (1)

Synthesis Example 1-1

45 g of 6,6'-(9H-fluoren-9,9-diyl)di(2-naphthol), 25 g of pentafluorobenzaldehyde, 5 g of oxalic acid, and 100 g of dioxane were mixed and stirred at 100° C. for 24 hours. After reaction, the reaction product was dissolved in 500 mL of methylisobutyl ketone, and the catalyst and metal impurities were removed by sufficiently washing with water. Further, the pressure was reduced to 2 mmHg at 150° C., and thus moisture and the solvent were removed under reduced pressure to obtain Novolak resin 1-1 shown below.

Novolak Resin 1-1

Molecular weight (Mw)=3,900

Dispersity (Mw/Mn)=4.90

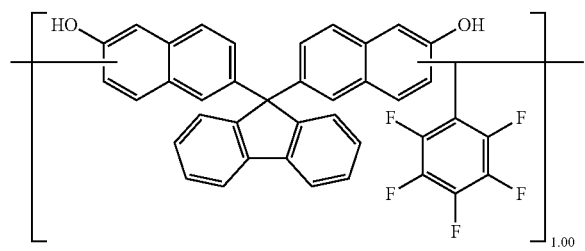

Novolak resin 1-1

Synthesis Example 1-2

45 g of 6,6'-(9H-fluoren-9,9-diyl)di(2-naphthol), 22 g of 4-(trifluoromethyl)benzaldehyde, 5 g of oxalic acid, and 100 g of dioxane were mixed, and Novolak resin 1-2 shown below was obtained in the same manner as in Synthesis example 1-1.

Novolak Resin 1-2

Molecular weight (Mw)=3,300

Dispersity (Mw/Mn)=4.99

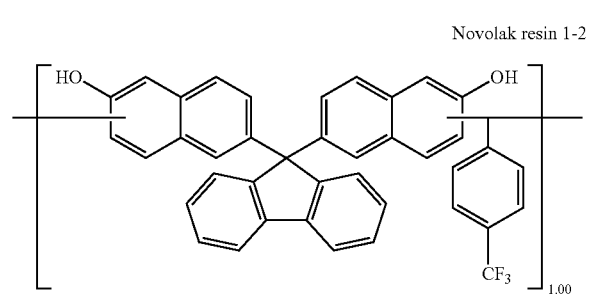

Novolak resin 1-2

Synthesis Example 1-3

32 g of 6,6'-(9H-fluoren-9,9-diyl)di(2-naphthol), 7.8 g of 4-(1,1,1,3,3,3-hexafluoro-2-propanol)phenol, 15 g of 4-fluorobenzaldehyde, 5 g of oxalic acid, and 100 g of dioxane were mixed, and Novolak resin 1-3 shown below was obtained in the same manner as in Synthesis example 1-1.

Novolak Resin 1-3

Molecular Weight (Mw)=5,400

Dispersity (Mw/Mn)=5.34

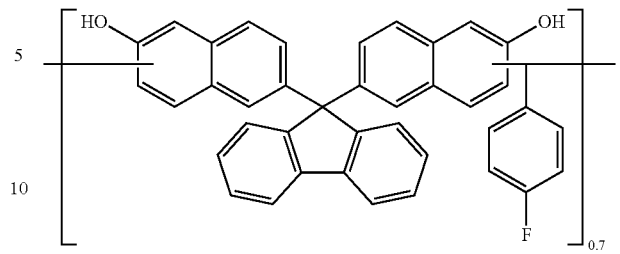

Novolak resin 1-3

Synthesis Example 1-4

30 g of 1,1'-methylenedi-2-naphthol, 21 g of 4-trifluoromethoxybenzaldehyde, 5 g of oxalic acid, and 100 g of dioxane were mixed, and Novolak resin 1-4 shown below was obtained in the same manner as in Synthesis example 1-1.

Novolak Resin 1-4

Molecular weight (Mw)=2,700

Dispersity (Mw/Mn)=3.22

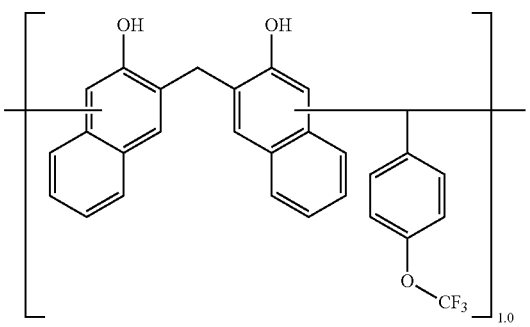

Novolak resin 1-4

Synthesis Example 1-5

42 g of α-naphtholphthalein, 17.8 g of 4-(1,1,1,3,3,3-hexafluoro-2-propanol)benzaldehyde, 5 g of oxalic acid, and 100 g of dioxane were mixed, and Novolak resin 1-5 shown below was obtained in the same manner as in Synthesis example 1-1.

Novolak Resin 1-5

Molecular weight (Mw)=2,600

Dispersity (Mw/Mn)=3.34

Novolak resin 1-5

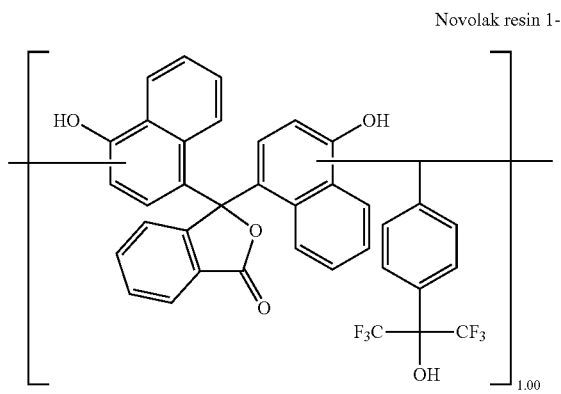

Novolak resin 1-7

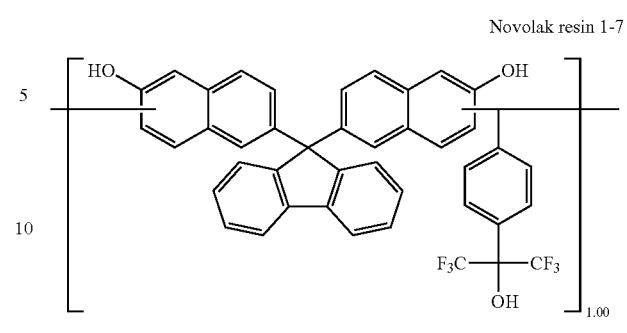

Synthesis Example 1-6

43 g of naphthofluorescein, 25 g of 4-(trifluoromethylthio)benzaldehyde, 5 g of oxalic acid, and 100 g of dioxane were mixed, and Novolak resin 1-6 shown below was obtained in the same manner as in Synthesis example 1-1.

Novolak Resin 1-6
  Molecular weight (Mw)=2,600
  Dispersity (Mw/Mn)=3.34

Novolak resin 1-6

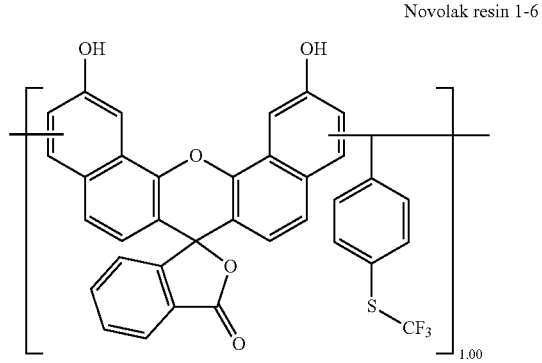

Synthesis Example 1-7

45 g of 6,6'-(9H-fluoren-9,9-diyl)di(2-naphthol), 17.8 g of 4-(1,1,1,3,3,3-hexafluoro-2-propanol)benzaldehyde, 5 g of oxalic acid, and 100 g of dioxane were mixed, and Novolak resin 1-7 shown below was obtained in the same manner as in Synthesis example 1-1.

Novolak Resin 1-7
  Molecular weight (Mw)=3,100
  Dispersity (Mw/Mn)=4.10

Synthesis Example 1-8

45 g of 6,6'-(9H-fluoren-9,9-diyl)di(2-naphthol), 20 g of a 75 mass % trifluoroacetaldehyde aqueous solution, 5 g of oxalic acid, and 100 g of dioxane were mixed, and Novolak resin 1-8 shown below was obtained in the same manner as in Synthesis example 1-1.

Novolak Resin 1-8
  Molecular weight (Mw)=2,200
  Dispersity (Mw/Mn)=4.22

Novolak resin 1-8

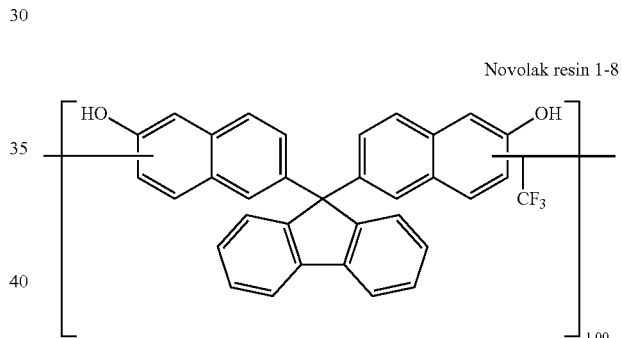

Synthesis of Novolak Resin having Repeating Unit Shown by Formula (2)

Synthesis Example 2-1

45 g of 6,6'-(9H-fluoren-9,9-diyl)di(2-naphthol), 120 g of a 37 mass % formalin aqueous solution, 5 g of oxalic acid, and 50 g of dioxane were mixed and stirred at 100° C. for 24 hours. After reaction, the reaction product was dissolved in 500 mL of methylisobutyl ketone, and the catalyst and metal impurities were removed by sufficiently washing with water. Further, the pressure was reduced to 2 mmHg at 150° C., and thus moisture and the solvent were removed under reduced pressure to obtain Novolak resin 2-1 shown below.

Novolak Resin 2-1
  Molecular weight (Mw)=3,100
  Dispersity (Mw/Mn)=3.88

Novolak resin 2-1

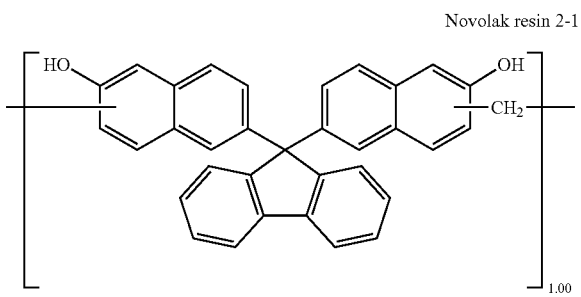

Synthesis Example 2-2

45 g of α-naphtholphthalein, 120 g of a 37 mass % formalin aqueous solution, 5 g of oxalic acid, and 50 g of dioxane were mixed, and Novolak resin 2-2 shown below was obtained in the same manner as in Synthesis example 2-1.
Novolak Resin 2-2
  Molecular weight (Mw)=2,100
  Dispersity (Mw/Mn)=3.67

Novolak resin 2-2

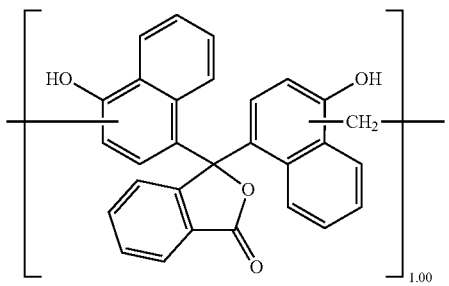

Synthesis Example 2-3

45 g of naphthofluorescein, 120 g of a 37 mass % formalin aqueous solution, 5 g of oxalic acid, and 50 g of dioxane were mixed, and Novolak resin 2-3 shown below was obtained in the same manner as in Synthesis example 2-1.
Novolak Resin 2-3
  Molecular weight (Mw)=2,600
  Dispersity (Mw/Mn)=3.55

Novolak resin 2-3

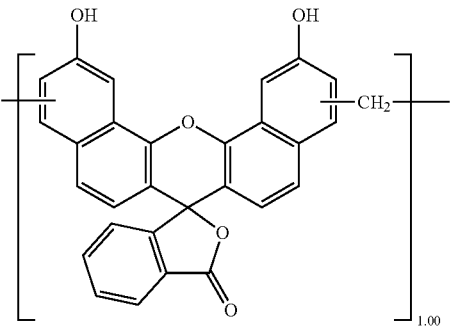

Synthesis Example 2-4

45 g of 6,6'-(9H-fluoren-9,9-diyl)di(2-naphthol), 60 g of a 37 mass % formalin aqueous solution, 5 g of oxalic acid, and 50 g of dioxane were mixed and stirred at 80° C. for 24 hours. After reaction, Novolak resin 2-4 shown below was obtained in the same manner as in Synthesis example 2-1.
Novolak Resin 2-4
  Molecular weight (Mw)=1,100
  Dispersity (Mw/Mn)=3.86

Novolak resin 2-4

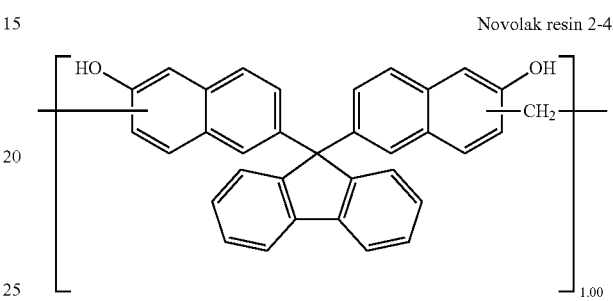

Examples 1-1 to 1-13, Comparative Examples 1-1 and 1-2

[Preparation of Resist Under Layer Film Composition]

The resins of Novolak resins 1-1 to 1-8 and Novolak resins 2-1 to 2-4 and Monomers 1 to 5 shown below were dissolved in an organic solvent containing 0.1 mass % of FC-4430 (available from Sumitomo 3M Ltd.) with the proportion shown in Table 1. The solution was filtered through a 0.1-μm filter made of a fluorine resin to prepare resist under layer film compositions (Under layer film compositions 1 to 13, Comparative under layer film compositions 1 and 2).

The prepared resist under layer film compositions (Under layer film compositions 1 to 13, Comparative under layer film compositions 1 and 2) were each applied onto a silicon (Si) substrate, and baked at 350° C. for 60 seconds to form a resist under layer film with a thickness of 100 nm. After formation of the resist under layer film, refractive index (n, k) at 193 nm wavelength was measured by a spectroscopic ellipsometer with a variable incident light angle (VASE) manufactured by J. A. Woollam Colo., Inc. The result is given in Table 1.

Monomers 1 to 5

Monomer 1

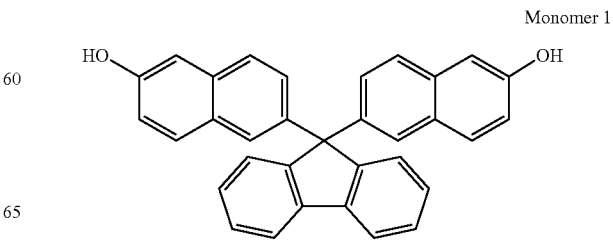

-continued

Monomer 2

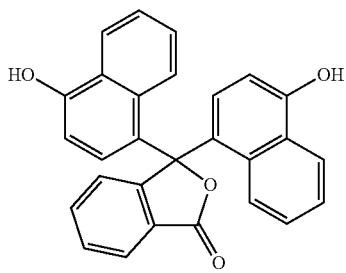

Monomer 3

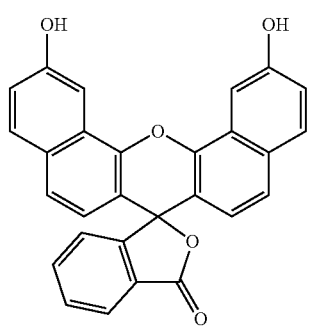

-continued

Monomer 4

Monomer 5

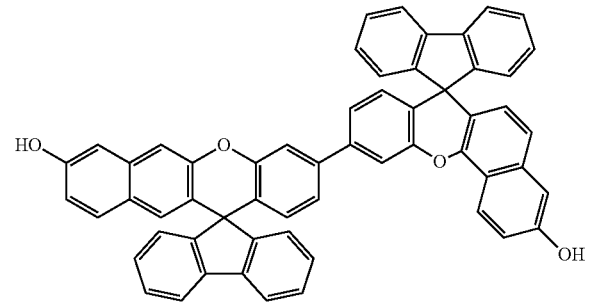

TABLE 1

| Resist under layer film composition | Polymer 1 (parts by mass) | Polymer 2 (parts by mass) | Additive (parts by mass) | Organic solvent (parts by mass) | n-value | k-value |
|---|---|---|---|---|---|---|
| Under layer film composition 1 | Novolak resin 1-1 (7) | Novolak resin 2-1 (43) | Monomer 1 (50) | PGMEA (2500) | 1.38 | 0.46 |
| Under layer film composition 2 | Novolak resin 1-2 (7) | Novolak resin 2-1 (43) | Monomer 1 (50) | PGMEA (2500) | 1.40 | 0.45 |
| Under layer film composition 3 | Novolak resin 1-3 (7) | Novolak resin 2-1 (43) | Monomer 1 (50) | PGMEA (2500) | 1.41 | 0.46 |
| Under layer film composition 4 | Novolak resin 1-4 (7) | Novolak resin 2-1 (43) | Monomer 1 (50) | PGMEA (2500) | 1.37 | 0.45 |
| Under layer film composition 5 | Novolak resin 1-5 (15) | Novolak resin 2-2 (25) | Monomer 2 (60) | PGMEA (2500) | 1.44 | 0.43 |
| Under layer film composition 6 | Novolak resin 1-6 (10) | Novolak resin 2-3 (30) | Monomer 3 (60) | PGMEA (2500) | 1.44 | 0.42 |
| Under layer film composition 7 | Novolak resin 1-1 (15) | Novolak resin 2-4 (85) | — | PGMEA (2500) | 1.38 | 0.47 |
| Under layer film composition 8 | Novolak resin 1-1 (20) | — | Monomer 4 (80) | PGMEA (2500) | 1.42 | 0.45 |
| Under layer film composition 9 | Novolak resin 1-2 (20) | — | Monomer 5 (80) | PGMEA (2500) | 1.43 | 0.43 |
| Under layer film composition 10 | Novolak resin 1-7 (50) | Novolak resin 2-1 (43) | Monomer 1 (50) | PGMEA (2500) | 1.42 | 0.43 |
| Under layer film composition 11 | Novolak resin 1-8 (100) | — | Monomer 1 (50) | PGMEA (2500) | 1.45 | 0.41 |
| Under layer film composition 12 | Novolak resin 1-8 (100) | — | — | PGMEA (2800) | 1.48 | 0.32 |
| Under layer film composition 13 | Novolak resin 1-8 (10) Novolak resin 1-1 (10) | Novolak resin 2-1 (30) | Monomer 5 (50) | PGMEA (2800) | 1.41 | 0.49 |
| Comparative under layer film composition 1 | — | Novolak resin 2-1 (50) | Monomer 1 (50) | PGMEA (4000) | 1.40 | 0.48 |
| Comparative under layer film composition 2 | — | Novolak resin 2-1 (100) | — | PGMEA (4000) | 1.39 | 0.49 |

PGMEA: propylene glycol monomethyl ether acetate

<Sublimate Measurement>

The prepared resist under layer film compositions (Under layer film compositions 1 to 13, Comparative under layer film compositions 1 and 2) were each applied onto a Si substrate, and baked under conditions shown in Table 2. The number of particles with a size of 0.3 μm or 0.5 μm generated in a hot plate oven under baking was measured with a particle counter KR-11A, manufactured by RION Co., Ltd. The result is given in Table 2.

TABLE 2

|  | Resist under layer film composition | Baking temperature (° C.) | 0.3-μm particles (number) | 0.5-μm particles (number) |
| --- | --- | --- | --- | --- |
| Example 1-1 | Under layer film composition 1 | 350 | 15 | 2 |
| Example 1-2 | Under layer film composition 2 | 350 | 12 | 1 |
| Example 1-3 | Under layer film composition 3 | 350 | 16 | 1 |
| Example 1-4 | Under layer film composition 4 | 320 | 6 | 0 |
| Example 1-5 | Under layer film composition 5 | 320 | 13 | 2 |
| Example 1-6 | Under layer film composition 6 | 360 | 11 | 2 |
| Example 1-7 | Under layer film composition 7 | 350 | 4 | 0 |
| Example 1-8 | Under layer film composition 8 | 350 | 13 | 7 |
| Example 1-9 | Under layer film composition 9 | 350 | 18 | 8 |
| Example 1-10 | Under layer film composition 10 | 350 | 15 | 2 |
| Example 1-11 | Under layer film composition 11 | 350 | 12 | 1 |
| Example 1-12 | Under layer film composition 12 | 350 | 0 | 0 |
| Example 1-13 | Under layer film composition 13 | 370 | 10 | 1 |
| Comparative example 1-1 | Comparative under layer film composition 1 | 350 | 102 | 29 |
| Comparative example 1-2 | Comparative under layer film composition 2 | 350 | 25 | 8 |

The result shows that Under layer film compositions 1 to 13 and Comparative under layer film composition 2 caused less particles at baking than Comparative under layer film composition 1. Thus, it was revealed that these compositions reduced generation of outgas and hardly contaminated an oven for baking. Moreover, it was also revealed that all under layer film compositions had adequate heat resistance.

<Evaluation of Filling Property on Substrate having Gaps>

A Si substrate on which a SiO₂ film with a thickness of 500 nm having a dense hole pattern with a size of 160 nm and a pitch of 320 nm has been formed was used as a substrate having gaps. The prepared resist under layer film compositions (Under layer film compositions 1 to 13, Comparative under layer film compositions 1 and 2) were each applied onto the SiO₂ film of the substrate having gaps under a condition where a film 100 nm thick can be formed on a flat Si substrate. Then, the wafer was cut to observe whether the bottoms of the holes were filled with the resist under layer film composition by SEM. The result is given in Table 3.

TABLE 3

|  | Resist under layer film composition | Baking temperature (° C.) | Filling state of hole pattern |
| --- | --- | --- | --- |
| Example 1-1 | Under layer film composition 1 | 350 | Under layer film filled the bottoms of holes, and no void occurred |
| Example 1-2 | Under layer film composition 2 | 350 | Under layer film filled the bottoms of holes, and no void occurred |
| Example 1-3 | Under layer film composition 3 | 350 | Under layer film filled the bottoms of holes, and no void occurred |
| Example 1-4 | Under layer film composition 4 | 320 | Under layer film filled the bottoms of holes, and no void occurred |
| Example 1-5 | Under layer film composition 5 | 320 | Under layer film filled the bottoms of holes, and no void occurred |
| Example 1-6 | Under layer film composition 6 | 360 | Under layer film filled the bottoms of holes, and no void occurred |
| Example 1-7 | Under layer film composition 7 | 350 | Under layer film filled the bottoms of holes, and no void occurred |
| Example 1-8 | Under layer film composition 8 | 360 | Under layer film filled the bottoms of holes, and no void occurred |
| Example 1-9 | Under layer film composition 9 | 360 | Under layer film filled the bottoms of holes, and no void occurred |
| Example 1-10 | Under layer film composition 10 | 350 | Under layer film filled the bottoms of holes, and no void occurred |
| Example 1-11 | Under layer film composition 11 | 350 | Under layer film filled the bottoms of holes, and no void occurred |
| Example 1-12 | Under layer film composition 12 | 350 | Under layer film filled the bottoms of holes, and no void occurred |
| Example 1-13 | Under layer film composition 13 | 370 | Under layer film filled the bottoms of holes, and no void occurred |
| Comparative example 1-1 | Comparative under layer film composition 1 | 350 | Under layer film filled the bottoms of holes, and no void occurred |
| Comparative example 1-2 | Comparative under layer film composition 2 | 350 | Voids occurred |

The result of Table 3 shows that Under layer film compositions 1 to 13 had good filling property even in a substrate having gaps with high aspect ratio, and the combination with Table 2 indicates that these compositions inhibited generation of outgas. By contrast, Comparative examples 1-1 and 1-2 could not accomplish both the achievement of filling property and the reduction in outgas.

<Preparation of Silicon-Containing Middle Layer Film Composition>

A silicon-containing polymer and an acid generator PAG1 shown below were dissolved in an organic solvent containing 0.1 mass % FC-4430 (available from Sumitomo 3M Ltd.) with the proportion shown in Table 4. The solution was filtered through a 0.1-μm filter made of a fluorine resin to prepare a silicon-containing middle layer film composition. The prepared silicon-containing middle layer film composition was applied onto a Si substrate, and baked at 200° C. for 60 seconds to form a silicon-containing middle layer film with a thickness of 40 nm. After formation of the silicon-containing middle layer film, refractive index (n, k) at 193 nm wavelength was measured by a spectroscopic ellipsometer with a variable incident light angle (VASE) manufactured by J. A. Woollam Co., Inc. The result is given in Table 4.

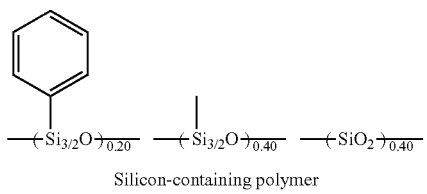

Silicon-containing polymer

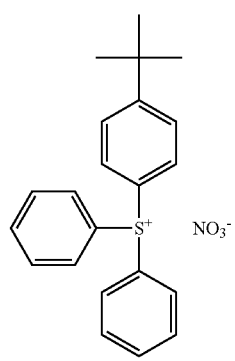

PAG1

TABLE 4

| | Polymer (parts by mass) | Acid generator (parts by mass) | Organic solvent (parts by mass) | Water (parts by mass) | n-value | k-value |
|---|---|---|---|---|---|---|
| Silicon-containing | Silicon-containing | PAG1 (2.0) | PGEE (4000) | Water (60) | 1.62 | 0.21 |

TABLE 4-continued

| | Polymer (parts by mass) | Acid generator (parts by mass) | Organic solvent (parts by mass) | Water (parts by mass) | n-value | k-value |
|---|---|---|---|---|---|---|
| middle layer film composition | polymer (100) | | | | | |

PGEE: propylene glycol ethyl ether

<Preparation of Resist Upper Layer Film Composition>

A resist polymer, an acid generator PAG2, and a quencher shown below were dissolved in an organic solvent containing 0.1 mass % FC-4430 (available from Sumitomo 3M Ltd.) with the proportion shown in Table 5. The solution was filtered through a 0.1-μm filter made of a fluorine resin to prepare a resist upper layer film composition (ArF Resist film composition).

TABLE 5

| Resist upper layer film composition | Polymer (parts by mass) | Acid generator (parts by mass) | Quencher (parts by mass) | Organic solvent (parts by mass) |
|---|---|---|---|---|
| ArF resist film composition | Resist polymer (100) | PAG2 (6.0) | Quencher (5.0) | PGMEA (2000) |

Resist Polymer

Molecular weight (Mw)=7,500

Dispersity (Mw/Mn)=1.92

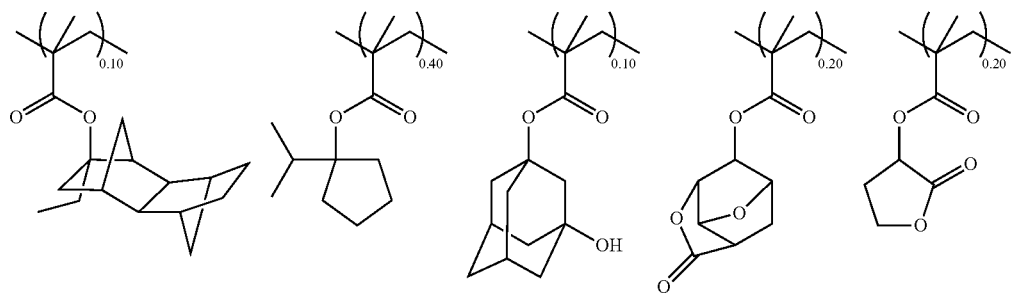

Resist polymer

PAG2

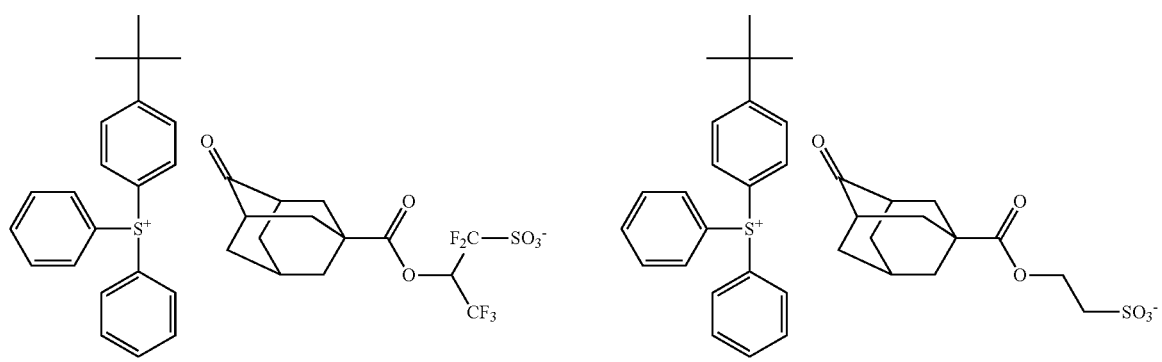

Quencher

Pattern Etching Test

Examples 2-1 to 2-13, Comparative Examples 2-1 and 2-2

The produced resist under layer film compositions (Under layer film compositions 1 to 13, Comparative under layer film compositions 1 and 2) were each applied onto a 300-mm Si wafer having a $SiO_2$ film 80 nm thick. Under layer film compositions 1 to 12 and Comparative under layer film compositions 1 and 2 were baked at 350° C. for 60 seconds, while Under layer film composition 13 was baked at 370° C. for 60 seconds, thereby forming a resist under layer film having a thickness of 100 nm each. The baking atmosphere of the resist under layer film was in air. The prepared silicon-containing middle layer film composition was applied thereon and baked at 200° C. for 60 seconds to form a middle layer film having a thickness of 35 nm, and the ArF resist film composition was applied thereon and baked at 105° C. for 60 seconds to form an ArF resist film having a thickness of 100 nm.

Then, the Si wafer substrate on which the 3-layer film has been formed as mentioned above was exposed to light with an ArF liquid immersion exposure apparatus (NSR-S610C manufactured by Nikon Corporation, NA: 1.30, σ: 0.98/ 0.65, 35° dipole s-polarized illumination, 6% halftone phase shift mask), baked at 100° C. for 60 seconds (PEB), and developed with a 2.38 mass % tetramethylammonium hydroxide (TMAH) aqueous solution for 30 seconds to obtain a 43 nm 1:1 positive line and space pattern.

Then, the pattern was transferred to the silicon-containing middle layer film by dry etching using the formed resist pattern as a mask with an etching apparatus Telius manufactured by Tokyo Electron Ltd. In the same manner, the pattern was transferred to the resist under layer film by dry etching using the silicon-containing middle layer film having the transferred pattern as a mask. The pattern was further transferred to the $SiO_2$ film by dry etching using the resist under layer film having the transferred pattern as a mask.

The etching condition was as follows.

| Transferring condition to silicon-containing middle layer film | |
|---|---|
| Chamber pressure | 10.0 Pa |
| RF power | 1,500 W |
| $CF_4$ gas flow rate | 15 sccm (mL/min) |
| $O_2$ gas flow rate | 75 sccm (mL/min) |
| Time | 15 sec |

| Transferring condition to resist under layer film | |
|---|---|
| Chamber pressure | 2.0 Pa |
| RF power | 500 W |
| Ar gas flow rate | 75 sccm (mL/min) |
| $O_2$ gas flow rate | 45 sccm (mL/min) |
| Time | 120 sec |

| Transferring condition to $SiO_2$ film | |
|---|---|
| Chamber pressure | 2.0 Pa |
| RF power | 2,200 W |
| $C_5F_{12}$ gas flow rate | 20 sccm (mL/min) |
| $C_2F_6$ gas flow rate | 10 sccm (mL/min) |
| Ar gas flow rate | 300 sccm (mL/min) |
| $O_2$ gas flow rate | 60 sccm (mL/min) |
| Time | 90 sec |

The wafer was cut, and cross-section of the pattern was observed with an electron microscope (S-4700) manufactured by Hitachi, Ltd., to compare pattern profiles after etching in each etching step and wiggling of the pattern after etching of the $SiO_2$ film. The result is given in Table 6.

TABLE 6

| | Under layer film composition | ArF resist film | Silicon-containing middle layer film | Resist under layer film | $SiO_2$ film | Wiggling of pattern |
|---|---|---|---|---|---|---|
| | | | Pattern profile after etching | | | |
| Example 2-1 | Under layer film composition 1 | Vertical profile | Vertical profile | Vertical profile | Vertical profile | None |
| Example 2-2 | Under layer film composition 2 | Vertical profile | Vertical profile | Vertical profile | Vertical profile | None |
| Example 2-3 | Under layer film composition 3 | Vertical profile | Vertical profile | Vertical profile | Vertical profile | None |
| Example 2-4 | Under layer film composition 4 | Vertical profile | Vertical profile | Vertical profile | Vertical profile | None |
| Example 2-5 | Under layer film composition 5 | Vertical profile | Vertical profile | Vertical profile | Vertical profile | None |
| Example 2-6 | Under layer film composition 6 | Vertical profile | Vertical profile | Vertical profile | Vertical profile | None |
| Example 2-7 | Under layer film composition 7 | Vertical profile | Vertical profile | Vertical profile | Vertical profile | None |
| Example 2-8 | Under layer film composition 8 | Vertical profile | Vertical profile | Vertical profile | Vertical profile | None |
| Example 2-9 | Under layer film composition 9 | Vertical profile | Vertical profile | Vertical profile | Vertical profile | None |
| Example 2-10 | Under layer film composition 10 | Vertical profile | Vertical profile | Vertical profile | Vertical profile | None |
| Example 2-11 | Under layer film composition 11 | Vertical profile | Vertical profile | Vertical profile | Vertical profile | None |

TABLE 6-continued

| | Under layer film composition | ArF resist film | Silicon-containing middle layer film | Resist under layer film after etching | SiO₂ film | Wiggling of pattern |
|---|---|---|---|---|---|---|
| | | | Pattern profile | | | |
| Example 2-12 | Under layer film composition 12 | Vertical profile | Vertical profile | Vertical profile | Vertical profile | None |
| Example 2-13 | Under layer film composition 13 | Vertical profile | Vertical profile | Vertical profile | Vertical profile | None |
| Comparative example 2-1 | Comparative under layer film composition 1 | Vertical profile | Vertical profile | Vertical profile | Vertical profile | None |
| Comparative example 2-2 | Comparative under layer film composition 2 | Vertical profile | Vertical profile | Vertical profile | Vertical profile | None |

The result shown in Table 6 demonstrates that the inventive resist under layer film composition enabled an good pattern to be formed even after dry etching, as well as the conventional resist under layer film. In addition, it was revealed that all under layer film compositions had adequate dry-etching resistance.

What is claimed is:

1. A resist under layer film composition comprising a novolak resin having a repeating unit shown by the formula (1),

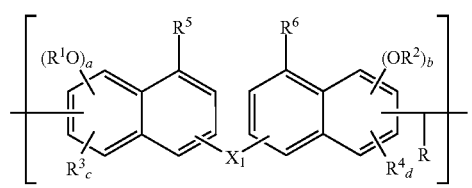

(1)

wherein $R^1$ and $R^2$ represent a hydrogen atom, an acid-labile group, a glycidyl group, or a linear, branched, or cyclic alkyl, alkenyl, alkynyl, acyl, or alkoxycarbonyl group having 1 to 10 carbon atoms; $R^3$ and $R^4$ represent a hydrogen atom, a halogen atom, a hydroxyl group, an alkoxy group having 1 to 4 carbon atoms, a linear, branched, or cyclic alkyl group having 1 to 10 carbon atoms, an alkenyl group having 2 to 10 carbon atoms, or an aryl group having 6 to 10 carbon atoms, in which the alkyl group, the alkenyl group, and the aryl group may contain a hydroxyl group, an alkoxy group, an acyloxy group, an ether group, or a sulfide group; $R^5$ and $R^6$ represent a hydrogen atom, or $R^5$ and $R^6$ may be bonded each other to form an ether bond; R represents an alkyl group having 1 to 10 carbon atoms or an aryl group having 6 to 16 carbon atoms, in which the alkyl group and the aryl group contain one or more fluorine atoms and may contain one or more groups selected from a hydroxyl group, an ether group, a sulfide group, a carboxyl group, and a nitrogen atom; $X_1$ represents a single bond or a linear, branched, or cyclic divalent hydrocarbon group having 1 to 38 carbon atoms and optionally containing a hydroxyl group, a carboxyl group, an ether group, or a lactone ring, and when $X_1$ is a divalent hydrocarbon group, $R^5$ and $R^6$ may bond to carbon atoms in $X_1$ to form an ether bond; and a, b, c, and d are each 1 or 2, and a substituted or unsubstituted bisnaphthol resin containing no fluorine atom.

2. The resist under layer film composition according to claim 1, further comprising either or both of a novolak resin having a repeating unit shown by the formula (2) and a bisnaphthol derivative shown by the formula (3),

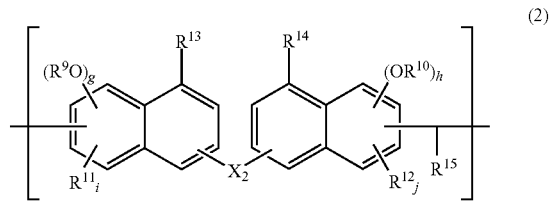

(2)

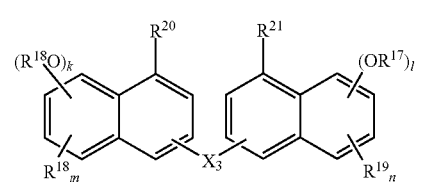

(3)

wherein $R^9$, $R^{10}$, $R^{16}$, and $R^{17}$ independently represent a hydrogen atom, an acid-labile group, a glycidyl group, or a linear, branched, or cyclic alkyl, acyl, or alkoxycarbonyl group having 1 to 10 carbon atoms; $R^{11}$, $R^{12}$, $R^{18}$, and $R^{19}$ independently represent a hydrogen atom, a halogen atom, a hydroxyl group, an alkoxy group having 1 to 4 carbon atoms, a linear, branched, or cyclic alkyl group having 1 to 10 carbon atoms, an alkenyl group having 2 to 10 carbon atoms, or an aryl group having 6 to 10 carbon atoms, in which the alkyl group, the alkenyl group, and the aryl group may contain a hydroxyl group, an alkoxy group, an acyloxy group, an ether group, or a sulfide group; $R^{13}$, $R^{14}$, $R^{20}$, and $R^{21}$ independently represent a hydrogen atom, or $R^{13}$ and $R^{20}$ may bond to $R^{14}$ and $R^{21}$ respectively to form an ether bond; $R^{15}$ represents a hydrogen atom, an alkyl group having 1 to 6 carbon atoms, an alkenyl group having 2 to 10 carbon atoms, or an aryl group having 6 to 10 carbon atoms, in which the alkyl group, the alkenyl group, and the aryl group may contain a hydroxyl group, an alkoxy group, an acyloxy group, an ether group, a sulfide group, a chloro group, or a nitro group; $X_2$ and $X_3$ independently represent a single bond or a linear, branched, or cyclic divalent hydrocarbon group having 1 to 38 carbon atoms and optionally containing a hydroxyl group, a carboxyl group, an ether group, or a lactone ring, when $X_2$ is a divalent hydrocarbon group, $R^{13}$ and $R^{14}$ may bond to carbon atoms in $X_2$ to form an ether bond, and when $X_3$ is a divalent hydrocarbon group, $R^{20}$ and $R^{21}$ may bond to carbon atoms in $X_3$ to form an ether bond; and g, h, i, j, k, l, m, and n are each 1 or 2.

3. The resist under layer film composition according to claim 2, wherein the novolak resin having the repeating unit shown by the formula (1) is a condensate of a substituted or unsubstituted bisnaphthol derivative with an aldehyde having at least one fluorine atom, and the novolak resin having the repeating unit shown by the formula (2) is a condensate of a substituted or unsubstituted bisnaphthol derivative with an aldehyde having no fluorine atom.

4. The resist under layer film composition according to claim 2, comprising the novolak resin having the repeating unit shown by the formula (1), the novolak resin having the repeating unit shown by the formula (2), and the bisnaphthol derivative shown by the formula (3).

5. The resist under layer film composition according to claim 3, comprising the novolak resin having the repeating unit shown by the formula (1), the novolak resin having the repeating unit shown by the formula (2), and the bisnaphthol derivative shown by the formula (3).

6. The resist under layer film composition according to claim 4, wherein a total amount of the novolak resin having the repeating unit shown by the formula (2) and the bisnaphthol derivative shown by the formula (3) is 5 to 10000 parts by mass with respect to 100 parts by mass of the novolak resin having the repeating unit shown by the formula (1).

7. The resist under layer film composition according to claim 5, wherein a total amount of the novolak resin having the repeating unit shown by the formula (2) and the bisnaphthol derivative shown by the formula (3) is 5 to 10000 parts by mass with respect to 100 parts by mass of the novolak resin having the repeating unit shown by the formula (1).

8. The resist under layer film composition according to claim 1, further comprising an organic solvent.

9. The resist under layer film composition according to claim 1, further comprising an acid generator and/or a crosslinking agent.

10. A patterning process for forming a pattern in a substrate by lithography, comprising: forming a resist under layer film on a substrate to be processed by using the resist under layer film composition according to claim 1; forming a silicon-containing middle layer film on the resist under layer film by using a silicon-containing middle layer film composition; forming a resist upper layer film on the silicon-containing middle layer film by using a resist upper layer film composition; forming a resist pattern in the resist upper layer film by exposure of a pattern circuit region of the resist upper layer film and development; transferring the pattern to the silicon-containing middle layer film by etching using the resist upper layer film having the formed resist pattern as a mask; transferring the pattern to the resist under layer film by etching using the silicon-containing resist middle layer film having the transferred pattern as a mask; forming the pattern in the substrate to be processed by etching using the resist under layer film having the transferred pattern as a mask.

11. A patterning process for forming a pattern in a substrate by lithography, comprising: forming a resist under layer film on a substrate to be processed by using the resist under layer film composition according to claim 1; forming an inorganic hard mask intermediate film selected from a silicon oxide film, a silicon nitride film, a silicon oxynitride film, a silicon carbide film, a polysilicon film, a titanium nitride film, a titanium oxide film, a titanium carbide film, a zirconium oxide film, and a hafnium oxide film on the resist under layer film; forming a resist upper layer film on the inorganic hard mask intermediate film by using a resist upper layer film composition; forming a resist pattern in the resist upper layer film by exposure of a pattern circuit region of the resist upper layer film and development; transferring the pattern to the inorganic hard mask intermediate film by etching using the resist upper layer film having the formed resist pattern as a mask; transferring the pattern to the resist under layer film by etching using the inorganic hard mask intermediate film having the transferred pattern as a mask; forming the pattern in the substrate to be processed by etching using the resist under layer film having the transferred pattern as a mask.

12. A patterning process for forming a pattern in a substrate by lithography, comprising: forming a resist under layer film on a substrate to be processed by using the resist under layer film composition according to claim 1; forming an inorganic hard mask intermediate film selected from a silicon oxide film, a silicon nitride film, a silicon oxynitride film, a silicon carbide film, a polysilicon film, a titanium nitride film, a titanium oxide film, a titanium carbide film, a zirconium oxide film, and a hafnium oxide film on the resist under layer film; forming an organic antireflection film on the inorganic hard mask intermediate film; forming a resist upper layer film on the organic antireflection film by using a resist upper layer film composition, thereby forming a 4-layer resist film; forming a resist pattern in the resist upper layer film by exposure of a pattern circuit region of the resist upper layer film and development; transferring the pattern to the organic antireflection film and the inorganic hard mask intermediate film by etching using the resist upper layer film having the formed resist pattern as a mask; transferring the pattern to the resist under layer film by etching using the inorganic hard mask intermediate film having the transferred pattern as a mask; forming the pattern in the substrate to be processed by etching using the resist under layer film having the transferred pattern as a mask.

13. A patterning process for forming a pattern in a substrate by lithography, comprising: forming a resist under layer film on a substrate to be processed by using the resist under layer film composition according to claim 1; forming an inorganic hard mask intermediate film selected from a silicon oxide film, a silicon nitride film, a silicon oxynitride film, a silicon carbide film, a polysilicon film, a titanium nitride film, a titanium oxide film, a titanium carbide film, a zirconium oxide film, and a hafnium oxide film on the resist under layer film; forming a hydrocarbon film on the inorganic hard mask intermediate film by using a hydrocarbon film composition by spin coating; forming a silicon-containing middle layer film on the hydrocarbon film by using a silicon-containing middle layer film composition; forming a resist upper layer film on the silicon-containing middle layer film by using a resist upper layer film composition, thereby forming a 5-layer resist film; forming a resist pattern in the resist upper layer film by exposure of a pattern circuit region of the resist upper layer film and development; transferring the pattern to the silicon-containing middle layer film by etching using the resist upper layer film having the formed resist pattern as a mask; transferring the pattern to the hydrocarbon film by etching using the silicon-containing middle layer film having the transferred pattern as a mask;

transferring the pattern to the inorganic hard mask intermediate film by etching using the hydrocarbon film having the transferred pattern as a mask; transferring the pattern to the resist under layer film by etching using the inorganic hard mask intermediate film having the transferred pattern as a mask; forming the pattern in the substrate to be processed by etching using the resist under layer film having the transferred pattern as a mask.

14. The patterning process according to claim 11, wherein the inorganic hard mask intermediate film is formed by a CVD method, an ALD method, or a sputtering method.

15. The patterning process according to claim 10, wherein the resist upper layer film composition does not contain a polymer having a silicon atom, and the etching of the resist under layer film using the silicon-containing middle layer film as a mask is performed with an etching gas containing an oxygen gas or a hydrogen gas.

16. The patterning process according to claim 11, wherein the resist upper layer film composition does not contain a polymer having a silicon atom, and the etching of the resist under layer film using the inorganic hard mask intermediate film as a mask is performed with an etching gas containing an oxygen gas or a hydrogen gas.

* * * * *